(12) United States Patent
Bauer et al.

(10) Patent No.: US 9,312,131 B2
(45) Date of Patent: Apr. 12, 2016

(54) SELECTIVE EPITAXIAL FORMATION OF SEMICONDUCTIVE FILMS

(75) Inventors: Matthias Bauer, Phoenix, AZ (US); Keith Doran Weeks, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 13/485,214

(22) Filed: May 31, 2012

(65) Prior Publication Data
US 2012/0244688 A1  Sep. 27, 2012

Related U.S. Application Data

(63) Continuation of application No. 11/536,463, filed on Sep. 28, 2006, now Pat. No. 8,278,176.

(60) Provisional application No. 60/811,703, filed on Jun. 7, 2006.

(51) Int. Cl.
| H01L 21/02 | (2006.01) |
| H01L 29/66 | (2006.01) |
| H01L 29/78 | (2006.01) |
| H01L 29/165 | (2006.01) |

(52) U.S. Cl.
CPC .... *H01L 21/02636* (2013.01); *H01L 21/02529* (2013.01); *H01L 21/02532* (2013.01); *H01L 21/02576* (2013.01); *H01L 29/66628* (2013.01); *H01L 29/66636* (2013.01); *H01L 29/78* (2013.01); *H01L 29/7848* (2013.01); *H01L 29/165* (2013.01)

(58) Field of Classification Search
None
See application file for complete search history.

(56) References Cited

U.S. PATENT DOCUMENTS

| 4,058,430 A | 11/1977 | Suntola et al. |
| 4,210,925 A | 7/1980 | Morcom et al. |
| 4,413,022 A | 11/1983 | Suntola et al. |

(Continued)

FOREIGN PATENT DOCUMENTS

| DE | 19820147 A1 | 7/1999 |
| JP | 59004040 | 1/1984 |

(Continued)

OTHER PUBLICATIONS

Office Action dated Oct. 9, 2012 in Japanese Application No. 2009-514271.

(Continued)

*Primary Examiner* — Jae Lee
(74) *Attorney, Agent, or Firm* — Knobbe Martens Olson & Bear LLP

(57) ABSTRACT

Epitaxial layers are selectively formed in semiconductor windows by a cyclical process of repeated blanket deposition and selective etching. The blanket deposition phases leave non-epitaxial material over insulating regions, such as field oxide, and the selective etch phases preferentially remove non-epitaxial material while deposited epitaxial material builds up cycle-by-cycle. Quality of the epitaxial material improves relative to selective processes where no deposition occurs on insulators. Use of a germanium catalyst during the etch phases of the process aid etch rates and facilitate economical maintenance of isothermal and/or isobaric conditions throughout the cycles. Throughput and quality are improved by use of trisilane, formation of amorphous material over the insulating regions and minimizing the thickness ratio of amorphous:epitaxial material in each deposition phase.

8 Claims, 18 Drawing Sheets

(56) References Cited

U.S. PATENT DOCUMENTS

| | | | |
|---|---|---|---|
| 4,521,952 A | 6/1985 | Riseman |
| 4,578,142 A | 3/1986 | Corboy, Jr. et al. |
| 4,605,947 A | 8/1986 | Price et al. |
| 4,698,316 A | 10/1987 | Corboy, Jr. et al. |
| 4,704,186 A | 11/1987 | Jastrzebski |
| 4,710,241 A | 12/1987 | Komatsu |
| 4,728,623 A | 3/1988 | Lu |
| 4,735,918 A | 4/1988 | Parsons |
| 4,747,367 A | 5/1988 | Posa |
| 4,749,440 A | 6/1988 | Blackwood et al. |
| 4,749,441 A | 6/1988 | Christenson |
| 4,758,531 A | 7/1988 | Beyer |
| 4,761,269 A | 8/1988 | Conger et al. |
| 4,778,775 A | 10/1988 | Tzeng |
| 4,786,615 A | 11/1988 | Liaw |
| 4,793,872 A | 12/1988 | Meunier |
| 4,834,809 A | 5/1989 | Kakihara |
| 4,857,479 A | 8/1989 | McLaughlin |
| 4,870,030 A | 9/1989 | Markunas et al. |
| 4,873,205 A | 10/1989 | Critchlow |
| 4,891,092 A | 1/1990 | Jastrzebski |
| 4,897,366 A | 1/1990 | Smeltzer |
| 4,923,826 A | 5/1990 | Jastrzebski |
| 4,966,861 A | 10/1990 | Mieno |
| 4,981,811 A | 1/1991 | Feygenson |
| 4,994,402 A | 2/1991 | Chiu |
| 5,004,705 A | 4/1991 | Blackstone |
| 5,011,789 A | 4/1991 | Burns |
| 5,028,973 A | 7/1991 | Bajor |
| 5,032,233 A | 7/1991 | Yu et al. |
| 5,037,775 A | 8/1991 | Reisman |
| 5,043,300 A | 8/1991 | Nulman |
| 5,045,494 A | 9/1991 | Choi |
| 5,059,544 A | 10/1991 | Burghartz |
| 5,061,644 A | 10/1991 | Yue |
| 5,061,655 A | 10/1991 | Ipposhi |
| 5,071,670 A | 12/1991 | Kelly |
| 5,084,406 A | 1/1992 | Rhodes et al. |
| 5,094,977 A | 3/1992 | Yu et al. |
| 5,112,439 A | 5/1992 | Reisman |
| 5,129,958 A | 7/1992 | Nagashima et al. |
| 5,144,376 A | 9/1992 | Kweon |
| 5,146,304 A | 9/1992 | Yue |
| 5,147,819 A | 9/1992 | Yu et al. |
| 5,148,604 A | 9/1992 | Bantien |
| 5,158,644 A | 10/1992 | Cheung et al. |
| 5,164,813 A | 11/1992 | Blackstone et al. |
| 5,175,121 A | 12/1992 | Choi et al. |
| 5,182,619 A | 1/1993 | Pfiester |
| 5,187,122 A | 2/1993 | Bonis |
| 5,196,360 A | 3/1993 | Doan et al. |
| 5,201,995 A | 4/1993 | Reisman et al. |
| 5,211,796 A | 5/1993 | Hansen |
| 5,231,056 A | 7/1993 | Sandhu |
| 5,234,857 A | 8/1993 | Kim et al. |
| 5,236,546 A | 8/1993 | Mizutani |
| 5,236,865 A | 8/1993 | Sandhu et al. |
| 5,252,841 A | 10/1993 | Wen et al. |
| 5,269,876 A | 12/1993 | Mizutani |
| 5,278,098 A | 1/1994 | Wei et al. |
| 5,282,926 A | 2/1994 | Trah et al. |
| 5,285,089 A | 2/1994 | Das |
| 5,319,220 A | 6/1994 | Suzuki et al. |
| 5,323,032 A | 6/1994 | Sato et al. |
| 5,324,679 A | 6/1994 | Kim et al. |
| 5,326,992 A | 7/1994 | Yoder |
| 5,341,016 A | 8/1994 | Prall et al. |
| 5,356,510 A | 10/1994 | Pribat et al. |
| 5,373,806 A | 12/1994 | Logar |
| 5,378,641 A | 1/1995 | Cheffings |
| 5,378,901 A | 1/1995 | Nii |
| 5,380,370 A | 1/1995 | Niino et al. |
| 5,389,575 A | 2/1995 | Chin et al. |
| 5,403,434 A | 4/1995 | Moslehi |
| 5,403,751 A | 4/1995 | Nishida et al. |
| 5,416,354 A | 5/1995 | Blackstone |
| 5,421,957 A | 6/1995 | Carlson et al. |
| 5,422,302 A | 6/1995 | Yonehara et al. |
| 5,422,502 A | 6/1995 | Kovacic |
| 5,425,842 A | 6/1995 | Zijlstra |
| 5,470,799 A | 11/1995 | Itoh et al. |
| 5,480,814 A | 1/1996 | Wuu et al. |
| 5,496,745 A | 3/1996 | Ryum et al. |
| 5,508,212 A | 4/1996 | Wang et al. |
| 5,508,536 A | 4/1996 | Twynam et al. |
| 5,512,772 A | 4/1996 | Maeda et al. |
| 5,517,943 A | 5/1996 | Takahashi |
| 5,557,117 A | 9/1996 | Matsuoka et al. |
| 5,557,118 A | 9/1996 | Hashimoto |
| 5,563,085 A | 10/1996 | Kohyama |
| 5,591,492 A | 1/1997 | Hirai et al. |
| 5,609,721 A | 3/1997 | Tsukune et al. |
| 5,656,519 A | 8/1997 | Mogami |
| 5,656,546 A | 8/1997 | Chen et al. |
| 5,670,404 A | 9/1997 | Dai |
| 5,670,801 A | 9/1997 | Nakano |
| 5,674,781 A | 10/1997 | Huang et al. |
| 5,683,922 A | 11/1997 | Jeng et al. |
| 5,693,147 A | 12/1997 | Ward et al. |
| 5,711,811 A | 1/1998 | Suntola et al. |
| 5,729,033 A | 3/1998 | Hafizi |
| 5,756,394 A | 5/1998 | Manning |
| 5,766,999 A * | 6/1998 | Sato .......................... 438/309 |
| 5,769,950 A | 6/1998 | Takasu et al. |
| 5,783,495 A | 7/1998 | Li et al. |
| 5,798,278 A | 8/1998 | Chan et al. |
| 5,831,335 A | 11/1998 | Miyamoto |
| 5,856,237 A | 1/1999 | Ku |
| 5,859,447 A | 1/1999 | Yang et al. |
| 5,879,459 A | 3/1999 | Gadgil et al. |
| 5,888,903 A | 3/1999 | O'Brien et al. |
| 5,899,752 A | 5/1999 | Hey et al. |
| 5,904,565 A | 5/1999 | Nguyen et al. |
| 5,916,365 A | 6/1999 | Sherman |
| 5,926,743 A | 7/1999 | Xi et al. |
| 5,933,761 A | 8/1999 | Lee |
| 5,945,350 A | 8/1999 | Violette et al. |
| 5,967,794 A | 10/1999 | Kodama |
| 5,986,287 A | 11/1999 | Eberl et al. |
| 5,998,305 A | 12/1999 | Holmer et al. |
| 6,031,255 A | 2/2000 | Delage et al. |
| 6,037,258 A | 3/2000 | Liu et al. |
| 6,042,654 A | 3/2000 | Comita et al. |
| 6,043,519 A | 3/2000 | Shealy et al. |
| 6,048,790 A | 4/2000 | Iacoponi et al. |
| 6,049,098 A | 4/2000 | Sato |
| 6,057,200 A | 5/2000 | Prall et al. |
| 6,058,945 A | 5/2000 | Fujiyama et al. |
| 6,060,397 A | 5/2000 | Seamons et al. |
| 6,069,068 A | 5/2000 | Rathore et al. |
| 6,074,478 A | 6/2000 | Oguro |
| 6,077,775 A | 6/2000 | Stumborg et al. |
| 6,083,818 A | 7/2000 | Stumborg et al. |
| 6,093,368 A | 7/2000 | Rafferty et al. |
| 6,100,184 A | 8/2000 | Zhao et al. |
| 6,117,761 A | 9/2000 | Manning |
| 6,139,700 A | 10/2000 | Kang et al. |
| 6,146,517 A | 11/2000 | Hoinkis |
| 6,147,405 A | 11/2000 | Hu |
| 6,153,010 A | 11/2000 | Kiyoku et al. |
| 6,164,295 A | 12/2000 | Ui et al. |
| 6,181,012 B1 | 1/2001 | Edelstein et al. |
| 6,183,565 B1 | 2/2001 | Granneman et al. |
| 6,184,128 B1 | 2/2001 | Wang et al. |
| 6,188,134 B1 | 2/2001 | Stumborg et al. |
| 6,190,453 B1 | 2/2001 | Boydston et al. |
| 6,190,976 B1 | 2/2001 | Shishiguchi et al. |
| 6,200,893 B1 | 3/2001 | Sneh |
| 6,203,613 B1 | 3/2001 | Gates et al. |
| 6,207,487 B1 | 3/2001 | Kim et al. |
| 6,207,567 B1 | 3/2001 | Wang et al. |
| 6,221,168 B1 | 4/2001 | Carter et al. |
| 6,225,213 B1 | 5/2001 | Urabe |
| 6,225,650 B1 | 5/2001 | Tadatomo et al. |

(56) References Cited

U.S. PATENT DOCUMENTS

| | | |
|---|---|---|
| 6,235,568 B1 | 5/2001 | Murthy et al. |
| 6,270,572 B1 | 8/2001 | Kim et al. |
| 6,277,735 B1 | 8/2001 | Matsubara |
| 6,287,965 B1 | 9/2001 | Kang et al. |
| 6,291,876 B1 | 9/2001 | Stumborg et al. |
| 6,303,523 B2 | 10/2001 | Cheung et al. |
| 6,316,795 B1 | 11/2001 | Croke, III |
| 6,335,251 B2 | 1/2002 | Miyano et al. |
| 6,340,619 B1 | 1/2002 | Ko |
| 6,342,448 B1 | 1/2002 | Lin et al. |
| 6,343,183 B1 | 1/2002 | Halpin et al. |
| 6,345,150 B1 | 2/2002 | Yoo |
| 6,348,096 B1 | 2/2002 | Sunakawa et al. |
| 6,351,039 B1 | 2/2002 | Jin et al. |
| 6,358,829 B2 | 3/2002 | Yoon et al. |
| 6,365,453 B1 | 4/2002 | DeBoer et al. |
| 6,368,954 B1 | 4/2002 | Lopatin et al. |
| 6,372,584 B1 | 4/2002 | Yu |
| 6,376,318 B1 | 4/2002 | Lee et al. |
| 6,380,065 B1 | 4/2002 | Komai et al. |
| 6,391,796 B1 | 5/2002 | Akiyama et al. |
| 6,415,198 B1 * | 7/2002 | Nallan et al. ................. 700/121 |
| 6,444,495 B1 | 9/2002 | Leung et al. |
| 6,454,854 B1 | 9/2002 | Ose |
| 6,455,935 B1 | 9/2002 | Hu |
| 6,462,411 B1 | 10/2002 | Watanabe et al. |
| 6,482,733 B2 | 11/2002 | Raaijmakers et al. |
| 6,486,018 B2 | 11/2002 | Roberts et al. |
| 6,524,953 B1 | 2/2003 | Hu |
| 6,555,839 B2 | 4/2003 | Fitzgerald |
| 6,555,845 B2 | 4/2003 | Sunakawa et al. |
| 6,566,279 B2 | 5/2003 | Suemitsu et al. |
| 6,583,015 B2 | 6/2003 | Fitzgerald et al. |
| 6,593,191 B2 | 7/2003 | Fitzgerald |
| 6,593,211 B2 | 7/2003 | Sato |
| 6,613,695 B2 | 9/2003 | Pomarede et al. |
| 6,614,695 B2 | 9/2003 | Keays |
| 6,657,223 B1 | 12/2003 | Wang et al. |
| 6,716,713 B2 | 4/2004 | Todd |
| 6,727,169 B1 | 4/2004 | Raaijmakers et al. |
| 6,743,721 B2 | 6/2004 | Lur et al. |
| 6,821,825 B2 | 11/2004 | Todd et al. |
| 6,881,633 B2 | 4/2005 | Hokazono |
| 6,900,115 B2 | 5/2005 | Todd |
| 6,958,253 B2 | 10/2005 | Todd |
| 6,962,859 B2 | 11/2005 | Todd et al. |
| 6,969,875 B2 | 11/2005 | Fitzgerald |
| 6,974,730 B2 | 12/2005 | Diaz |
| 6,998,305 B2 | 2/2006 | Arena et al. |
| 7,026,219 B2 | 4/2006 | Pomarede et al. |
| 7,108,748 B2 | 9/2006 | Brabant et al. |
| 7,153,772 B2 | 12/2006 | Granneman et al. |
| 7,186,630 B2 | 3/2007 | Todd |
| 7,312,128 B2 | 12/2007 | Kim et al. |
| 7,335,959 B2 | 2/2008 | Curelio et al. |
| 7,405,131 B2 | 7/2008 | Chong et al. |
| 7,732,305 B2 | 6/2010 | Ye et al. |
| 7,759,199 B2 | 7/2010 | Thomas et al. |
| 7,960,256 B2 | 6/2011 | Ye et al. |
| 8,367,528 B2 | 2/2013 | Bauer et al. |
| 2001/0001742 A1 | 5/2001 | Huang et al. |
| 2001/0034123 A1 | 10/2001 | Jeon et al. |
| 2001/0046766 A1 | 11/2001 | Asakawa |
| 2002/0022347 A1 | 2/2002 | Park et al. |
| 2002/0023520 A1 | 2/2002 | Hu |
| 2002/0034864 A1 * | 3/2002 | Mizushima et al. .......... 438/486 |
| 2002/0052124 A1 | 5/2002 | Raaijmakers et al. |
| 2002/0168868 A1 | 11/2002 | Todd |
| 2003/0036268 A1 | 2/2003 | Brabant et al. |
| 2003/0080361 A1 | 5/2003 | Murthy et al. |
| 2003/0082300 A1 | 5/2003 | Todd et al. |
| 2003/0230233 A1 | 12/2003 | Fitzgerald et al. |
| 2004/0171238 A1 | 9/2004 | Arena et al. |
| 2004/0185665 A1 | 9/2004 | Kishimoto et al. |
| 2004/0224089 A1 | 11/2004 | Singh et al. |
| 2004/0262694 A1 | 12/2004 | Chidambaram |
| 2005/0023520 A1 | 2/2005 | Lee et al. |
| 2005/0079692 A1 | 4/2005 | Samoilov et al. |
| 2005/0093021 A1 | 5/2005 | Ouyang et al. |
| 2005/0176220 A1 | 8/2005 | Kanemoto |
| 2005/0250298 A1 | 11/2005 | Bauer |
| 2006/0011984 A1 | 1/2006 | Currie |
| 2006/0014366 A1 | 1/2006 | Currie |
| 2006/0038243 A1 * | 2/2006 | Ueno et al. .................... 257/408 |
| 2006/0057821 A1 | 3/2006 | Lee et al. |
| 2006/0115933 A1 | 6/2006 | Ye et al. |
| 2006/0115934 A1 * | 6/2006 | Kim et al. .................... 438/149 |
| 2006/0131665 A1 * | 6/2006 | Murthy et al. ................ 257/384 |
| 2006/0166414 A1 | 7/2006 | Carlson et al. |
| 2006/0169668 A1 | 8/2006 | Samoilov |
| 2006/0169669 A1 | 8/2006 | Zojaji et al. |
| 2006/0205194 A1 | 9/2006 | Bauer |
| 2006/0228842 A1 | 10/2006 | Zhang |
| 2006/0234504 A1 | 10/2006 | Bauer et al. |
| 2006/0289900 A1 | 12/2006 | Thirupapuliyur et al. |
| 2007/0006800 A1 | 1/2007 | Lee et al. |
| 2007/0048956 A1 | 3/2007 | Dip et al. |
| 2007/0287272 A1 | 12/2007 | Bauer et al. |
| 2009/0075029 A1 | 3/2009 | Thomas et al. |
| 2009/0075447 A1 | 3/2009 | Meunier-Beillard et al. |
| 2011/0117732 A1 | 5/2011 | Bauer et al. |
| 2011/0230036 A1 | 9/2011 | Ye et al. |

FOREIGN PATENT DOCUMENTS

| | | |
|---|---|---|
| JP | H02-163942 | 12/1988 |
| JP | H04-260325 | 2/1991 |
| JP | H07-022338 | 7/1993 |
| JP | 60-10673 A | 1/1994 |
| JP | 1997-251967 | 9/1997 |
| JP | 1999-514154 | 1/1998 |
| JP | 10256354 | 9/1998 |
| JP | 2001-189451 | 12/1999 |
| JP | 2000-208437 | 7/2000 |
| JP | 2001-284468 | 10/2001 |
| JP | 2005-340816 | 5/2005 |
| JP | 2005-217391 | 8/2005 |
| JP | 2009-538390 | 11/2009 |
| KR | 1020050104228 A | 11/2005 |
| KR | 1020050104229 A | 11/2005 |
| WO | WO 96/17107 | 6/1996 |
| WO | WO 99/41423 | 8/1999 |
| WO | WO 99/62109 | 12/1999 |
| WO | WO 00/11721 | 3/2000 |
| WO | WO 00/13207 | 3/2000 |
| WO | WO 00/15866 | 3/2000 |
| WO | WO 00/15881 | 3/2000 |
| WO | WO 00/16377 | 3/2000 |
| WO | WO 00/22659 | 4/2000 |
| WO | WO 00/55895 | 9/2000 |
| WO | WO 00/75964 A3 | 12/2000 |
| WO | WO 00/79576 A1 | 12/2000 |
| WO | WO 01/15220 A1 | 3/2001 |
| WO | WO 01/36702 A1 | 5/2001 |
| WO | WO 01/45149 A1 | 6/2001 |
| WO | WO 01/50502 | 7/2001 |
| WO | WO 01/66832 A3 | 9/2001 |
| WO | WO 01/78123 A1 | 10/2001 |
| WO | WO 01/78124 A1 | 10/2001 |
| WO | WO 01/99166 A1 | 12/2001 |
| WO | WO 2005/043591 | 5/2005 |
| WO | WO 2005/071725 | 8/2005 |
| WO | WO 2006/060339 A2 | 6/2006 |
| WO | WO 2008/063543 A2 | 5/2008 |

OTHER PUBLICATIONS

Abeles et al.; *Amorphous Semiconductor Superlattices*; Physical Review Letters; Nov. 21, 1983; pp. 2003-2006; vol. 51; No. 21.

Antonell et al., "Carbon incorporation for strain compensation during solid phase epitaxial recrystallization of SiGe on Si at 500-600° C", J. Appl. Phys. 79 (10), pp. 7646-7651 (1996).

(56) References Cited

OTHER PUBLICATIONS

Aoyama et al, "Segregation of interface carbon during silicon epitaxial growth by UHV-CVD", *Journal of Crystal Growth*, 157, pp. 323-326 (1995).

Aoyama et al, "Si selective epitaxial growth using $Cl_2$ pulsed molecular flow method", *Thin Solid Films*, 321, pp. 256-260 (1998).

Bauer et al, "$Si_3H_8$ based epitaxy of biaxially stressed silicon films doped with carbon and arsenic for CMOS applications", in *Semiconductor Defect Engineering—Materials, Synthetic Structures and Devices*, edited by S. Ashok et al, (Mater. Res. Soc. Symp. Proc. 864, Warrendale, PA, 2005), E4.30.

Bauer et al, "Tensile strained selective silicon carbon alloys for recessed source drain areas of devices", Meeting Abstract, *Electrochem. Soc.*, 602, p. 1414 (2006).

Bauer et al., "Time resolved reflectivity measurements of silicon solid phase epitaxial regrowth", Thin Solid Films 364, pp. 228-232 (2000).

Bedair; *Selective area and sidewall growth by atomic layer epitaxy*; Semicond Sci. Technol; 1993; 1052-1062; vol. 8.

Berti et al, "Lattice parameter in $Si_{1-y}C_y$ epilayers: Deviation from Vegard's rule", *Applied Physics Letters*, 72(13), pp. 1602-1604 (Mar. 30, 1998).

Bogumilowicz et al, "Chemical vapour etching of Si, SiGe and Ge with $HCl$; applications to the formation of thin relaxed SiGe buffers and to the revelation of threading dislocations", *Semicond. Sci. Technol.*, 20, pp. 127-134 (2005).

Celotti et al, "Lattice parameter study of silicon uniformly doped with boron and phosphorus", *Journal of Materials Science*, 9(5), pp. 821-828 (May 1974).

Chowdhury et al. "In-Situ Real-Time Mass Spectroscopic Sensing and Mass Balance Modeling of Selective Area Silicon PECVD", *AIP Conference Proceedings, American Institute of Physics*, vol. 449, Mar. 23, 1998, pp. 363-367.

Develyn et al, "Adsorption, desorption, and decomposition of $HCl$ and HBr on Ge(100)—Competitive pairing and near-first-order desorption-kinetics", *Journal of Chemical Physics*, 101(3), pp. 2463-2475 (1994).

Düscö et al.; *Deposition of Tin Oxide into Porous Silicon by Atomic Layer Epitaxy*; J. Electrochem. Soc.; Feb. 1996; pp. 683-687; vol. 143, No. 2.

Eberl et al., "Structural properties of SiC and SiGeC alloy layers on Si", Chapter 2.5 in "Properties of Silicon Germanium and SiGe:Carbon", Institution of Electrical Engineers, pp. 75-77 (1999).

Fazan et al.; *A High-C Capacitor (20.4 Ff/um2) with Ultrathin CVD—Ta2O5 Films Deposited on Rugged Poly-Si for High Density DRAMs*; IEEE; 1992; pp. IDEM 92-263-IDEM 92-266.

Feng et al., "Raman determination of layer stresses and strains for heterostructures and its application to the cubic SiC/Si system", J. Appl. Phys. 64 (12), pp. 6827-6835 (1988).

George et al.; *Nucleation and Growth During Tungsten Atomic Layer Deposition on Oxide Surfaces*; Mat. Res. Symp. Proc. vol. 672; Materials Research Society 2001; 07.7.1-07.7.7.

Goesele et al, "Diffusion Engineering by Carbon in Silicon", in *Si Front-End Processing Physics and Technology of Dopant-Defect Interactions II*, edited by A. Agarwal et al, (Mater. Res. Soc. Symp. Proc. 610, San Francisco CA, 2000), B7.1.

Hartmann et al, "High C content $Si/Si_{1-y}C_y$ heterostructures for n-type metal oxide semiconductor transistors", *Semicond. Sci. Technol.*, 19, pp. 593-601 (2004).

Haukka et al.; *Chemisorption of chromium acetylacetonate on porous high surface area silica*; Applied Surface Science; 1994; pp. 220-227.

Hiltunen et al.; *Nitrides of Titanium, Niobium, Tantalum and Molybdenum Grown as Thin Films by the Atomic Layer Epitaxy Method*; Thin Solid Films; 1988; pp. 149-154; vol. 166.

Horiike et al.; *Filling of Si Oxide into a Deep Trench using Digital CVD Method*; Applied Surface Science; 1990; pp. 168-174; vol. 46.

Hoyt, "Substitutional carbon incorporation and electronic characterization of $Si_{1-y}C_y$/Si and $Si_{1-x-y}Ge_xC_y$/Si heterojunctions", Chapter 3 in *Silicon-Germanium Carbon Alloy*, Taylor and Francis, pp. 5989 (New York 2002).

International Search Report and Written Opinion of the International Searching Authority for International Application No. PCT/US2007/011464 mailed Mar. 12, 2007.

Iyer et al, "Synthesis of $Si_{1-y}C_y$ alloys by molecular beam epitaxy", *Applied Physics Letters*, 60(3), pp. 356-358 (Jan. 20, 1992).

Jeong S. Byun, Kwan G. Rha et al., "Epitaxial TiSi2 Growth on Si(100) From Reactive Sputtered TiNx and Subsequent Annealing", Materials Research Soc. Proceedings, vol. 355, Pittsburgh, 1995, pp. 465-470.

Jeong Soo Byun, "Epitaxial C49-TiSi2 Formation on (100)Si Substrate Using TiNx and Its Electrical Characteristics as a Shallow Contact Metallization", J. Electrochem. Soc., vol. 143, No. 6, Jun. 1996, pp. 1984-1991.

Jeong Soo Byun, Chang Reol Kim et al., "TiN/TiSi2 Formation Using TiNx Layer and Its Feasibilities in ULSI", Jpn. J. Appl. Phys. vol. 35 (1995), pp. 982-986.

Jeong Soo Byun, Hak Nam Kim et al., "Formation of a large grain sized TiN layer using TiNx, the epitaxial continuity at the Al/TiN interface . . . ", J. Appl. Phys. 78(3), Aug. 1, 1995, pp. 1719-1724.

Jeong Soo Byun, Jun Ki Kim et al., "W as a Bit Line Interconnection in Capacitor-Over-Bit-Line (COB) Structured Dynamic Random Access Memory (DRAM) and Feasible Diffusion Barrier Layer", Jpn. J. Appl. Phys. vol. 35 (1996), pp. 1086-1089.

Jin et al.; *Porous Silica Xerogel Processing and Integration for ULSI Applications*; Materials Research Society Symposium Proceedings; 1998; pp. 213-222; vol. 511.

Jorke, "Segregation of Ge and dopant atoms during growth of SiGe layers", Chapter 6.3 in "Properties of Silicon Germanium and SiGe:Carbon", Institution of Electrical Engineers, pp. 287-301 (1999).

Juppo et al.; *Deposition of copper films by an alternate supply of CuCl and Zn*; J. Vac. Sci. Technol.; 1997; pp. 2003; vol.-issue A 15(4).

Kaizuka et al.; *Conformal Chemical Vapor Deposition TiN(111) Film Formation as an Underlayer of Al for Highly Reliable Interconnects*; Jpn. J. Appl. Phys.; 1994; pp. 470-474; vol. 33.

Kelires, "Monte Carlo studies of ternary semiconductor alloys: application to the $Si_{1-x-y}Ge_xC_y$ system", Physical Review B, 75, pp. 1114-1117 (Aug. 7, 1995).

Kelires, "Short-range order, bulk moduli, and physical trends in $c-Si_{1-x}C_x$ alloys", *Physical Review B*, 55, pp. 8784-8787 (Apr. 1, 1997).

Kikkawa et al.; *A Quarter-Micrometer Interconnection Technology Using a TiN/Al—Si—Cu/TiN/Al—Si—Cu/TiN/Ti Multilayer Structure*; IEEE Transactions on Electron Devices; Feb. 1993; pp. 296-302; vol. 40, No. 2.

Kikkawa et al.; *Al—Si—Cu/TiN multilayer interconnection and Al—Ge reflow sputtering technologies for quarter-micron devices*; SPIE; 1992; pp. 54-64; vol. 1805.

Kim et al.; *Applicability of ALE Tin films as Cu/Si diffusion barriers*; Thin Solid Films; 2000; pp. 276-283; 372(1).

Kim et al.; *Comparison of TiN and TiAlN as a Diffusion Barrier Deposited by Atomic Layer Deposition*; Journal of the Korean Physical Society; 2002; pp. 176-179; 40(1).

Kim et al., "Low temperature selective Si epitaxy by reduced pressure chemical vapor deposition introducing periodic deposition and etching cycles with SiH4, H2 and HCl". Mat. Res. Soc. Symp. Proc. vol. 609 © 2000 Materials Research Society. pp. A8.2.1 to A8.2.6.

Kim et al., "Low Temperature Selective Si Epitaxy by Reduced Chemical Vapor Deposition Introducing Periodic Deposition and Etching Cycles with SiH4, H2 and HCl", Mat. Res. Soc. Symp. Proc., 2000, vol. 609.

Klaus et al.; *Atomic Layer Deposition of SiO2 Using Catalyzed and Uncatalyzed Self-Limiting Surface Reactions*; Surface Review and Letters; 1999; pp. 435-448; vol. 6, Nos. 3 & 4.

Klaus et al.; *Atomic Layer Deposition of Tungsten Nitride Films Using Sequential Surface Reactions*; J. Electrochem Soc.; 2000; 1175-1181; 147(3).

(56) References Cited

OTHER PUBLICATIONS

Klaus et al.; *Atomically controlled growth of tungsten and tungsten nitride using sequential surface reactions*; Applied Surface Science; 2000; pp. 479-491; vols. 162-163.

Koo et al.; *Study on the characteristics of TiAlN thin film deposited by atomic layer deposition method*; Journal of Vacuum Science & Technology, A: Vacuum Surfaces, and Films; 2001; 2931-2834; 19(6).

Kouvetakis et al., "Synthesis and analysis of compounds and alloys in the GeC, SiC, and SiGeC systems", Chapter 2 in Series—Optoelectronic properties of semiconductors and superlattices; v. 15 Silicon-germanium carbon alloy / edited by S.T. Pantelides and S. Zollner; pp. 19-58.

Kukli et al.; *Atomic Layer Epitaxy Growth of Tantalum Oxide Thin Films from Ta(OC2H5)5 and H2O*; J. Electrochem. Soc.; May 1995; pp. 1670-1674; vol. 142, No. 5.

Kuznetsov et al., "Continuity in development of ultra shallow junctions for 130-45 nm CMOS: the tool and annealing methods," Abstract 11th IEEE, RTP 2003 Conference, Sep. 23-26, 2003, Charleston, USA.

Lauwers, et al., "Low temperature spike anneal for Ni-silicide formation," Microelectronic Engineering 76, 303-310 (MAM2004, Brussels, Belgium, Mar. 7-10, 2004).

Leskelä et al.; *Atomic Layer Epitaxy in Deposition of Various Oxide and Nitride Thin Films*; Journal De Physique IV, Colloque C5, supplement au Journal de Physique II; Jun. 1995; pp. C5-937-C5-951; vol. 5.

Lin et al, "Chlorine-induced Si surface segregation on the Ge-terminated Si/Ge(100) surface from core-level photoemission", *Physical Review B*, 64, 233302 (2001).

Lin at el, "Atomistics of Ge deposition on Si(100) by atomic layer epitaxy", *Physical Review Letters*, 90(4), 046102 (Jan. 31, 2003).

Lou, et al., "The Process Window of a-Si/Ti Bilayer Metallization for an Oxidation-Resistant and Self-Aligned TiSi2 Process," IEEE Transactions on Electron Devices, vol. 39, No. 8, Aug. 1992, pp. 1835-1843.

MacKnight et al., "RTP applications and technology options for the sub-45 nm node", Proceedings, RTP2004 Conference (Portland, OR) (2004).

Martens et al., "Study of Ni-Silicide Contacts to Si:C Source/Drain", The Electrochemical Society Meeting, Oct. 30, 2006, Cancun, Mexico.

Martensson et al.; *Atomic layer epitaxy of copper an ab inition investigation of the CuCl/H2 process III. Reaction barriers*; Appl. Surf. Sci.; 2000; 92-100; 157(1).

Martensson et al.; *Atomic Layer Epitaxy of Copper on Tantalum*; Chemical Vapor Deposition; 1997; pp. 45-50; vol. 3, No. 1.

Martensson et al.; *Atomic Layer Epitaxy of Copper, Growth and Selectivity in the Cu(II)—2,2,6, 6-tetramethyl-3,5-heptanedionate/H2 Process*; J. Electrochem. Soc.; Aug. 1998; pp. 2926-2931; vol. 145, No. 8.

Martensson et al.; *CU(THD)2 as Copper Source in Atomic Layer Epitaxy*; Proc. Electrochem. Soc.; 1997; 1529-1536; 97-25.

Martensson et al.; *Use of Atomic Layer Epitaxy for Fabrication of Si/TiN/Cu Structures*; J. Vac. Sci. Technol. B, Sep./Oct. 1999; pp. 2122-2128; vol. 17, No. 5.

McVay et al, "The diffusion of germanium in silicon", *Journal of Applied Physics*, 44(3), pp. 1409-1410 (Mar. 1973).

McVay et al, "Diffusion of Ge in SiGe alloys", *Physical Review B*, 9, 627-631 (Jan. 1974).

Meléndez-Lira et al., "Substitutional carbon in $Si_{1-y}C_y$ alloys as measured with infrared absorption and Raman spectroscopy", J. Appl. Phys. 82, pp. 4246-4252 (1997).

Min et al.; *Atomic Layer Deposition of TiN Films by Alternate Supply of Tetrakis (ethylmethylamino)-Titanium and Ammonia*; Japanese Journal of Applied Physics; 1998; pp. 4999-5004; vol. 37.

Min et al.; *Chemical Vapor Deposition of Ti—Si—N Films with Alternating Source Supply*; Mat. Res. Soc. Symp. Proc.; 1999; pp. 207-210; vol. 564; Materials Research Society.

Min et al.; *Metal-Organic Atomic-Layer Deposition of Titanium-Silicon-Nitride Films*; Applied Physics Letters; 1999; pp. 1521-1523; vol. 75, No. 11.

Min; *Atomic Layer Deposition of TiN Thin Films by Sequential Introduction of Ti Precursor and NH3*; Materials Research Society Symposium Proceedings; 1998; pp. 337-343; vol. 514.

Mitchell et al, "Germanium diffusion in polysilicon emitters of SiGe heterojunction bipolar transistors fabricated by germanium implantation", *Journal of Applied Physics*, 92(11), pp. 6924-6926 (Dec. 1, 2002).

Moller; *Copper and Nickel Ultrathin Films on Metal-Oxide Crystal Surfaces* Mater. Soc. Monogr.; 1994; 473-522; 81.

Nakahata et al, "Low thermal budge surface cleaning after dry etching for selective silicon epitaxial growth", *Journal of Crystal Growth*, 226, pp. 443-450 (2001).

Nakahata et al, "Formation of selective epitaxially grown silicon with a flat edge by ultra-high vacuum chemical vapor deposition", *Journal of Crystal Growth*, 233, pp. 82-87 (2001).

Nakahata et al, "Optimization of process conditions of selective epitaxial growth for elevated source/drain CMOS transistor", *Journal of Crystal Growth*, 243, pp. 87-93 (2002).

Nakahata et al, "Low thermal budget selective epitaxial growth for formation of elevated source/drain MOS transistors", *Journal of Crystal Growth*, 264, pp. 79-85 (2004).

Niinistö et al.; *Synthesis of oxide thin films and overlayers by atomic layer epitaxy for advanced applications*; Materials Science and Engineering; 1996; pp. 23-29; vol. B41.

O'Neil et al., "Optimization of process conditions for selective silicon epitaxy using disilane, hydrogen, and chlorine", J. Electrochem. Soc. 144 (9), pp. 3309-3315 (1997).

Oehme et al., "A novel measurement method of segregating adlayers in MBE", Thin Solid Films 369, pp. 138-142 (2000).

Oehme et al, "Carbon segregation in silicon", *Thin Solid Films*, 380(1-2), pp. 75-77 (Dec. 22, 2000).

Osten et al, "Substitutional versus interstitial carbon incorporation during pseudomorphic growth of $Si_{1-y}C_y$ on Si(001)", *Journal of Applied Physics*, 80(12), pp. 6711-6715 (Dec. 15, 1996).

Osten et al, "Substitutional carbon incorporation in epitaxial $Si_{1-y}C_y$ alloys on Si(001) grown by molecular beam epitaxy", *Applied Physics Letters*, 74(6), pp. 836-838 (Feb. 8, 1999).

Ott et al.; *Modification of Porous Alumina membranes Using Al2O3 Atomic Layer Controlled Deposition*; Chem. Mater.; 1997; pp. 707-714; vol. 9.

Pages, et al., "The effect of ramp rate—short process time and partial reactions on cobalt and nickel silicide formation," Proceedings 205th ECS Meeting, May 9-13, 2004, San Antonio TX, USA, p. 174-182.

PCT Search Report, PCT Application PCT/US2006/003333; Jun. 30, 2006.

PCT Search Report, PCT Application PCT/US2006/003465; Jul. 7, 2006.

Ritala et al.; *Atomic Layer Epitaxy Growth of TiN Thin Films from Tila and NH3*; J. Electrochem. Soc.; Aug. 1998; pp. 2914-2920; vol. 145; No. 8.

Ritala et al.; *Controlled Growth of TaN, Ta3N5, and TaOxNy Thin Filims by Atomic Layer Deposition*; Chem. Mater.; 1999; pp. 1712-1718; vol. 11.

Ritala et al.; *Effects of intermediate zinc pulses on properties of TiN and NbN films deposited by atomic layer epitaxy*; Appl. Surf. Sci.; 1997; 199-212; 120.

Ritala et al.; *Perfectly Conformal TiN and Al2O3 Films Deposited by Atomic Layer Deposition*; Chem Vap. Deposition; 1999; pp. 7-9; vol. 5, No. 1.

Rossnagel et al.; *Plasma-enhanced atomic layer deposition of Ta and Ti for interconnect diffusin barriers*; J. Vac. Sci. Technol.; 2000; 2016-2020; 18(4).

Ryan et al.; *Material Property Characterization and Integration Issues for Mesoporous Silica*; IEEE, 1999; pp. IITC 99-187-IITC 99-189.

Sakaue et al.; *Digital Chemical Vapor Deposition of SiO2 Using a Repetitive Reaction of Triethylsilane/Hydrogen and Oxidation*; Japanese Journal of Applied Physics; Jan. 1990; pp. L124-L127; vol. 30, No. 1B.

(56) References Cited

OTHER PUBLICATIONS

Singer; *Atomic Layer Deposition Targets Thin Films*; Semiconductor International; Sep. 1999; pp. 40.
Smith et al., "Plasma Enhanced Selective Area Micocrystalline Silicon Deposition on Hydrogenated Amorphous Silicon: Surface Modification for Controlled Nucleation", *Journal of Vacuum Science and Technology*, American Institute of Physics, vol. 16, No. 3, May 1998, pp. 1316-1320.
Sneh et al.; *Atomic layer growth of SiO2 on Si(100) using SiCl4 and H2O in a binary reaction sequence*; Surface Science; 1995; pp. 135-152; vol. 334.
Solanki et al.; *Atomic Layer Deposition of Copper Seed Layers*; Electrochem. and Solid State Lett.; 2000; 479-480; 3(10).
Soman et al, "Selective area chemical vapor deposition of $Si_{1-x}Ge_x$ thin film alloys by the alternating cyclic method: Experimental data: II. Morphology and composition as a function of deposition parameters", *Journal of the Electrochemical Society*, 147(5), pp. 1854-1858 (May 2000).
Soman et al, "Selective area chemical vapor deposition of $Si_{1-x}Ge_x$ thin film alloys by the alternating cyclic method: A thermodynamic analysis: II. The system Si—Ge—C$\ell$—H—Ar", *Journal of the Electrochemical Society*, 147(11), pp. 4342-4344 (Nov. 2000).
Sakurai et al, "Adsorption, diffusion and desorption of C$\ell$ atoms on Si(111) surfaces", *Journal of Crystal Growth*, 237-239, pp. 212-216 (2002).
Strane et al., "Carbon incorporation into Si at high concentrations by ion implantation and solid phase epitaxy", J. Appl. Phys. 79 (2), pp. 637-646 (1996).
Strane et al., "Precipitation and relaxation in strained $Si1-yCy/Si$ heterostructures", J. Appl. Phys. 76(6), pp. 3656-3668 (1994).
Tiitta et al.; *Preparation and Characterization of Phosphorus-Doped Aluminum Oxide Thin Films*; Materials Research Bulletin; 1998; pp. 1315-1323; vol. 33, No. 9.
U.S. Department of Commerce National Technical Information Service; *Ceramic Coatings on Metals Using Atomic Layer Controlled Chemical Vapor Deposition* (Assert-96); Feb. 16, 2000; Colorado University at Boulder.
Utriainen et al.; *Studies of metallic thin film growth in an atomic layer epitaxy reactor using M(ACAC)2 (M=Ni,Cu,Pt) precursors*; Appl. Surf. Sci.; 2000; 151-158; 157(3).
Van Houtum, H. et al., "TiSi2 strap formation by Ti-amorphous-Si reaction," J. Vac. Sci. Technol. B 6(6), Nov./Dec. 1988, pp. 1734-1739.
Van Zant, "Microchip Fabrication", 4th Ed., McGraw Hill (New York, NY), pp. 364-365 (2000).
Violette et al., "On the role of chlorine in selective silicon epitaxy by chemical vapor deposition", J. Electrochem. Soc. 143 (10), pp. 3290-3296 (1996).
Wang; *Spin on Dielectric Films—A General Overview*; 1998 5th International Conference on Solid-State and Integrated Circuit Technology Proceedings; Oct. 21-23, 1998; p. 961; Beijing, China.
Windl et al., "Theory of strain and electronic structure of $Si_{1-y}C_y$ and $Si_{1-x-y}Ge_xC_y$ alloys", Phys. Rev. B57 (4), pp. 2431-2442 (1998).
Wise et al.; *Diethyldiethoxysilane as a New Precursor for SiO2 Growth on Silicon*; Mat. Res. Soc. Symp. Proc.; 1994; pp. 37-43; vol. 334.
Wolansky et al, "Low temperature clean for Si/SiGe epitaxy for CMOS integration of heterojunction bipolar transistors", *Proceedings of the 8th International Symposium on Silicon Materials Science and Technology* 1, pp. 812-821 (1998).
Wolf et al.; *Process and Equipment Simulation of Copper Chemical Vapor Deposition Using Cu(hfac)vtms*; Microelectronic Engineering; 1999; 15-27; 45.
Wolf et al, "Silicon processing for the VLSI era vol. 1: Process technology", Lattice Press, pp. 140-142 and 155-156 (Sunset Beach, CA 1986).
Wolf et al, "Silicon epitaxial growth and silicon on insulator", Chapter 7 in *Silicon Processing for the VLSI Era, vol. 1: Process technology*, 2nd Ed., pp. 225-264 (2000).
Wu et al, "Thermal reactions on the C$\ell$-termination SiGe(100) surface", *Surface Science*, 507-510, pp. 295-299 (2002).
Wu et al, "Stability and mechanism of selective etching of ultrathin Ge films on the Si(100) surface upon chlorine adsorption", *Physical Review B*, 69, 045308 (2004).
Yagi et al.; *Substitutional C incorporation into $Si1-yCy$ alloys using novel carbon source, 1,3-disilabutane*; Japanese Journal of Applied Physics; 2004; pp. 4153-4154; vol. 43, No. 7A.
Yamamoto et al, "Chemical vapor phase etching of polycrystalline selective to epitaxial Si and SiGe", *Thin Solid Films* 508, pp. 297-300 (2006).
Zhu, "Modeling of germanium and antimony diffusion in $Si_{1-x}Ge_x$", *Electrochemical Society Proceedings*, Jul. 2004, pp. 923-934 (2004).
Aldao, et al., Halogen etching of Si via atomic-scale processes, Progress in Surface Science, 2001, pp. 189-230, vol. 68.
Aldao, et al., Atomic processes during Ci supersaturation etching of Si(100)-(2 X 1), Physical Review, 2009, 125303, vol. 79.
Agrawal, et al, Ci Insertion on Si (100)-(2 X 1): Etching Under Conditions of Supersaturation, Mar. 30, 2007, 136104, PRL 98.
Aketagawa, et al, The influence of $Cl_2$ on $Si_{1-x}Ge_x$ selective epitaxial growth and B doping properties by UHV-CVD, Journal of Crystal Growth, 1993, pp. 484-488, vol. 127.
Aketagawa, et al., Limitations of selective growth conditions in gas-source MBE using $Si_2H_6$, Journal of Crystal Growth, 1991, pp. 860-863, vol. 111.
Antonell, et al., Carbon incorporated for strain compensation during solid phase epitaxial recrystallization of SiGe on Si at 500-600° C, J. Appl. Phys., May 15, 1996, vol. 79, No. 10.
Bauer, et al, Low temperature selective epitaxial growth of SiCP on Si(110) oriented surfaces, Thin Solid Films, 2012, pp. 3144-3148, vol. 520.
Bauer, et al., Lower temperature catalyst enhanced etch process with high etch rate selectivity for amorphous silicon based alloys over single-crystalline silicon based alloys, Thin Solid Films, 2012, pp. 3139-3143, vol. 520.
Bauer, et al., Low Temperature Si:C co-flow and hybrid process using $Si_3H_8/Cl_2$, Thin Solid Films, 2012, pp. 3133-3138, vol. 520.
File History for U.S. Appl. No. 12/149,865, filed May 31, 2011.
Gao, et al, Comparison of Cl2 and HCl adsorption on Si(100)-(2 X 1), Thin Solid Films, 1993, pp. 140-144, vol. 225.
Gao, et al., Influence of phosphine flow rate on Si growth rate in gas source molecular beam epitaxy, Journal of Crystal Growth, 2000, pp. 461-465, vol. 220.
Maruno, et al., Selective Epitaxial Growth by Ultrahigh-Vacuum Chemical Vapor Deposition with Alternating Gas Supply of $Si_2H_6$ and $Cl_2$, Jpn. J. Appl. Phys., Nov. 2000, pp. 6139-6142, vol. 39.
Office Action dated Feb. 12, 2013, received in Japanese Patent Application 2009-514271, with English translation.
Office Action dated Feb. 22, 2013 for U.S. Appl. No. 13/111,917.
Ogryzlo, et al., Doping and crystallographic effects in Cl-atom etching of silicon, J. Appl. Phys., Mar. 15, 1990, pp. 3115-3120, vol. 67, No. 6.
Ogryzlo, et al., The etching of doped polycrystalline silicon by molecular chlorine, J. Appl. Phys., Dec. 1, 1988, pp. 6510-6514, vol. 64, No. 11.
Preliminary Notice of First Office Action dated Jan. 22, 2013 for R.O.C Patent application 96118850.
Tatsumi, et al., Selective epitaxial growth by UHV-CVD using $Si_2H_6$ and $Cl_2$, Journal of Crystal Growth, 1992, pp. 275-278, vol. 120.
Violette, et al., Low temperature selective silicon epitaxy by ultra high vacuum rapid thermal chemical vapor deposition using $Si_2H_6$, $H_2$ and $Cl_2$, Appl. Phys., Jan. 1, 1996, pp. 66-68, No. 1, vol. 68.
English Translation of Korean Office Action, issued in Application No. 10-2009-7000140, dated Apr. 29, 2014.

* cited by examiner

US 9,312,131 B2

SELECTIVE EPITAXIAL FORMATION OF SEMICONDUCTIVE FILMS

CROSS-REFERENCE TO RELATED APPLICATIONS

This application claims the priority benefit under 35 U.S.C. §120 to U.S. application Ser. No. 11/536,463 filed on Sep. 28, 2006 and under 35 U.S.C. §119(e) to U.S. provisional application No. 60/811,703, filed Jun. 7, 2006, the disclosures of which are hereby incorporated by reference.

This application is also related to U.S. patent application Ser. No. 11/343,275 (filed 30 Jan. 2006), U.S. patent application Ser. No. 11/343,264 (filed 30 Jan. 2006), U.S. Patent Application Publication 2003/0036268 (filed 29 May 2002), and U.S. Pat. No. 6,998,305 (filed 23 Jan. 2004). The entire disclosure of all of these related applications is hereby incorporated by reference herein.

FIELD OF THE INVENTION

This invention relates generally to the deposition of silicon-containing materials in semiconductor processing, and relates more specifically to selective formation of silicon-containing materials on semiconductor windows.

BACKGROUND OF THE INVENTION

In forming integrated circuits, epitaxial layers are often desired in selected locations, such as active area mesas among field isolation regions, or even more particularly over defined source and drain regions. While non-epitaxial (amorphous or polycrystalline) material can be selectively removed from over the field isolation regions after deposition, it is typically considered more efficient to simultaneously provide chemical vapor deposition (CVD) and etching chemicals, and to tune conditions to result in zero net deposition over insulative regions and net epitaxial deposition over exposed semiconductor windows. This process, known as selective epitaxial CVD, takes advantage of slow nucleation of typical semiconductor deposition processes on insulators like silicon oxide or silicon nitride. Such selective epitaxial CVD also takes advantage of the naturally greater susceptibility of amorphous and polycrystalline materials to etchants, as compared to the susceptibility of epitaxial layers.

Examples of the many situations in which selective epitaxial formation of semiconductor layers is desirable include a number of schemes for producing strain. The electrical properties of semiconductor materials such as silicon, germanium and silicon germanium alloys are influenced by the degree to which the materials are strained. For example, silicon exhibits enhanced electron mobility under tensile strain, and silicon germanium exhibits enhanced hole mobility under compressive strain. Methods of enhancing the performance of semiconductor materials are of considerable interest and have potential applications in a variety of semiconductor processing applications. Semiconductor processing is typically used in the fabrication of integrated circuits, which entails particularly stringent quality demands, as well as in a variety of other fields. For example, semiconductor processing techniques are also used in the fabrication of flat panel displays using a wide variety of technologies, as well as in the fabrication of microelectromechanical systems ("MEMS").

A number of approaches for inducing strain in silicon- and germanium-containing materials have focused on exploiting the differences in the lattice constants between various crystalline materials. For example, the lattice constant for crystalline germanium is 5.65 Å, for crystalline silicon is 5.431 Å, and for diamond carbon is 3.567 Å. Heteroepitaxy involves depositing thin layers of a particular crystalline material onto a different crystalline material in such a way that the deposited layer adopts the lattice constant of the underlying single crystal material. For example, using this approach strained silicon germanium layers can be formed by heteroepitaxial deposition onto single crystal silicon substrates. Because the germanium atoms are slightly larger than the silicon atoms, but the deposited heteroepitaxial silicon germanium is constrained to the smaller lattice constant of the silicon beneath it, the silicon germanium is compressively strained to a degree that varies as a function of the germanium content. Typically, the band gap for the silicon germanium layer decreases monotonically from 1.12 eV for pure silicon to 0.67 eV for pure germanium as the germanium content in the silicon germanium increases. In another approach, tensile strain is provided in a thin single crystalline silicon layer by heteroepitaxially depositing the silicon layer onto a relaxed silicon germanium layer. In this example, the heteroepitaxially deposited silicon is strained because its lattice constant is constrained to the larger lattice constant of the relaxed silicon germanium beneath it. The tensile strained heteroepitaxial silicon typically exhibits increased electron mobility. In both of these approaches, the strain is developed at the substrate level before the device (for example, a transistor) is fabricated.

In these examples, strain is introduced into single crystalline silicon-containing materials by replacing silicon atoms with other atoms in the lattice structure. This technique is typically referred to as substitutional doping. For example, substitution of germanium atoms for some of the silicon atoms in the lattice structure of single crystalline silicon produces a compressive strain in the resulting substitutionally doped single crystalline silicon material because the germanium atoms are larger than the silicon atoms that they replace. It is possible to introduce a tensile strain into single crystalline silicon by substitutional doping with carbon, because carbon atoms are smaller than the silicon atoms that they replace. Additional details are provided in "Substitutional Carbon Incorporation and Electronic Characterization of $Si_{1-y}C_y/Si$ and $Si_{1-x-y}Ge_xC_y/Si$ Heterojunctions" by Judy L. Hoyt, Chapter 3 in "Silicon-Germanium Carbon Alloy", Taylor and Francis, pp. 59-89 (New York 2002), the disclosure of which is incorporated herein by reference, and is referred to herein as "the Hoyt article." However, non-substitutional impurities will not induce strain.

Similarly, electrical dopants should also be substitutionally incorporated into epitaxial layers in order to be electrically active. Either the dopants are incorporated as deposited or they will need to be annealed to achieve the desired level of substitutionality and dopant activation. In situ doping of either impurities for tailored lattice constant or electrical dopants are often preferred over ex situ doping followed by annealing to incorporate the dopant into the lattice structure because the annealing consumes thermal budget. However, in practice in situ substitutional doping is complicated by the tendency for the dopant to incorporate non-substitutionally during deposition, for example, by incorporating interstitially in domains or clusters within the silicon, rather than by substituting for silicon atoms in the lattice structure. Non-substitutional doping complicates, for example, carbon doping of silicon, carbon doping of silicon germanium, and doping of silicon and silicon germanium with electrically active dopants. As illustrated in FIG. 3.10 at page 73 of the Hoyt article, prior deposition methods have been used to make crystalline silicon having an in situ doped substitutional carbon content of up to 2.3 atomic %, which corresponds to a lattice spacing of over 5.4 Å and a tensile stress of less than 1.0 GPa.

SUMMARY OF THE INVENTION

In accordance with another aspect of the invention a method is provided for selectively forming semiconductor material in semiconductor windows. The method includes providing a substrate within a chemical vapor deposition chamber, where the substrate comprises insulating surfaces and single-crystal semiconductor surfaces. Semiconductor material is blanket deposited over the insulating surfaces and the single-crystal semiconductor surfaces of the substrate, such that a thickness ratio of non-epitaxial semiconductor material over the insulating surfaces to epitaxial semiconductor material over the single-crystal semiconductor surfaces is less than about 1.6:1. Non-epitaxial semiconductor material is selectively removed from over the insulating surfaces, wherein blanket depositing and selectively removing are conducted within the chemical vapor deposition chamber.

In accordance with another aspect of the invention a method is provided for selectively forming epitaxial semiconductor material. Semiconductor material is blanket deposited to form epitaxial material over single-crystal semiconductor regions of a substrate and to form non-epitaxial material over insulating regions of the substrate. The non-epitaxial material is selectively removed from over the insulating regions by exposing the blanket deposited semiconductor material to an etch chemistry including a halide source and a germanium source. Blanket depositing and selectively removing are repeated at least once.

In accordance with another aspect of the invention a method is provided for forming silicon-containing material in selected locations on a substrate. The method includes providing a substrate having exposed windows of single-crystal semiconductor among field isolation regions. Silicon-containing material is blanket deposited over the windows of single-crystal material and the field isolation regions by flowing trisilane over the substrate. The silicon-containing material is selectively removed from over the field isolation regions. Blanket depositing and selectively removing are repeated in a plurality of cycles.

In accordance with another aspect of the invention a method is provided for selectively forming epitaxial semiconductor material. The method includes providing a substrate with insulating regions and semiconductor windows formed therein. Amorphous semiconductor material is deposited over the insulating regions and the epitaxial semiconductor material is deposited over the semiconductor windows. The amorphous semiconductor material is selectively etched from over the insulating regions while leaving at least some epitaxial semiconductor material in the semiconductor windows. Blanket depositing and selectively removing are repeated in a plurality of cycles.

BRIEF DESCRIPTION OF THE DRAWINGS

Example embodiments of the methods and systems disclosed herein are illustrated in the accompanying drawings, which are for illustrative purposes only. The drawings comprise the following figures, in which like numerals indicate like parts.

DETAILED DESCRIPTION OF THE INVENTION

Figure 1:
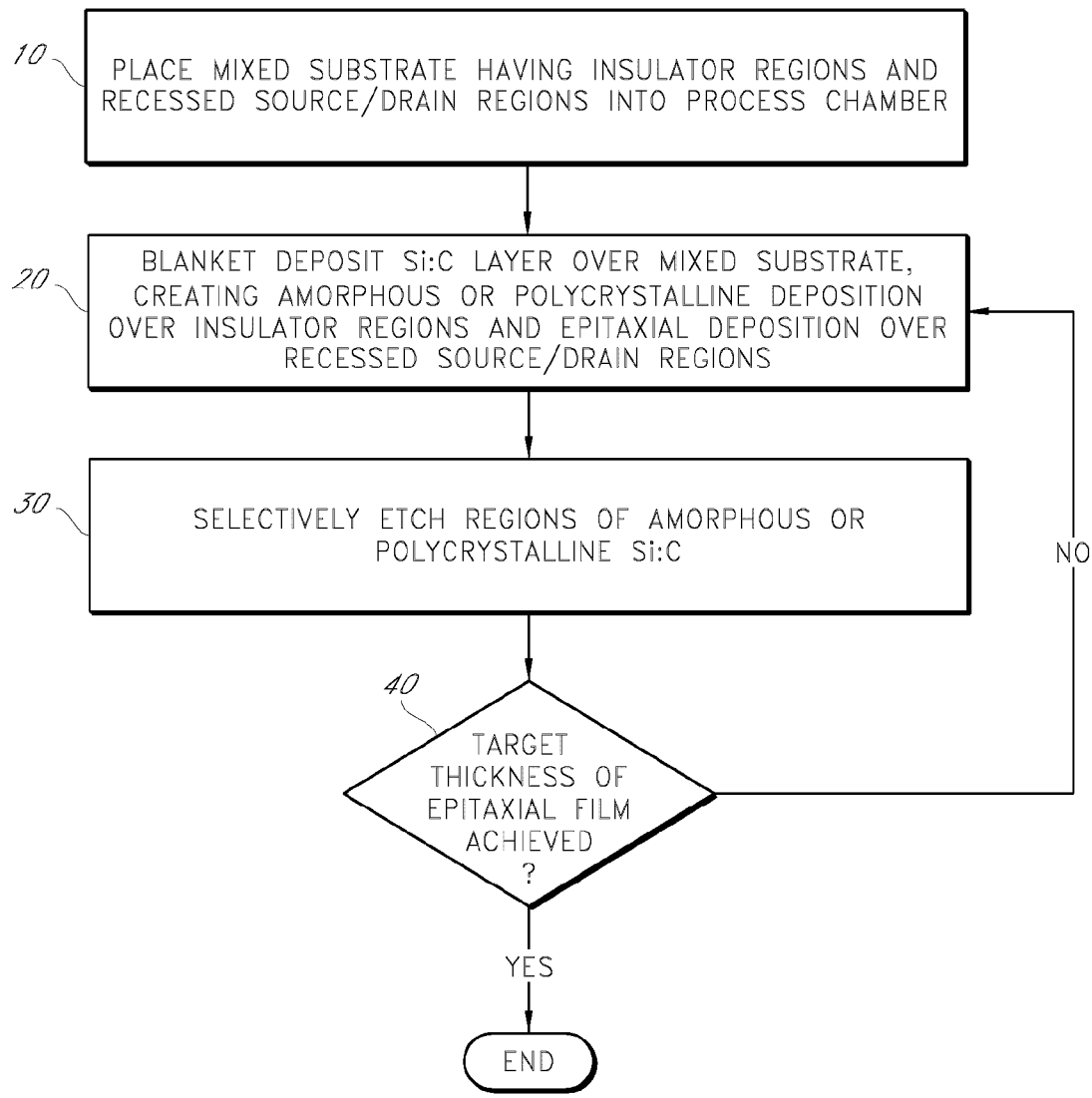
FIG. 1 is a flowchart illustrating a process for selectively forming epitaxial semiconductor layers, using the particular example of depositing a carbon-doped silicon film in recessed source/drain regions of a mixed substrate.

Deposition techniques often attempt to tailor the amount or kind of deposition in different regions of a substrate. For example, U.S. Pat. No. 6,998,305 recognizes that simultaneous etch and deposition reactions are know for selective deposition on silicon without depositing on silicon oxide. To control deposition on a third type of surface, namely an exposed transistor gate, the '305 patent teaches cyclically alternating a selective deposition with an etch phase. However, the inventors have recognized that selective deposition chemistries sometimes have undesirably effects on the deposited layers. While the described embodiments involve the specific example of carbon-doped silicon for NMOS applications, the skilled artisan will appreciate that the methods described herein have application to a variety of semiconductor applications where selective formation of a layer is desired but etchants can interfere with desired properties of the deposited layer.

Deposition methods exist that are useful for making a variety of substitutionally doped single crystalline silicon-containing materials. For example, it is possible to perform in situ substitutional carbon doping of crystalline silicon by performing the deposition at a relatively high rate using trisilane ($Si_3H_8$) as a silicon source and a carbon-containing gas or vapor as a carbon source. Carbon-doped silicon-containing alloys have a complementary nature to silicon germanium systems. The degree of substitutional doping is 70% or greater, expressed as the weight percentage of substitutional carbon dopant based on the total amount of carbon dopant (substitutional and non-substitutional) in the silicon. Techniques for forming carbon-doped silicon-containing materials have overcome several challenges, including the large lattice mismatch between carbon and silicon, the low solubility of carbon in silicon, and the tendency of carbon-doped silicon to precipitate. Additional details relating to in situ substitutional carbon doping of crystalline silicon are provided in U.S. patent application Ser. No. 11/343,275 (filed 30 Jan. 2006).

The term "silicon-containing material" and similar terms are used herein to refer to a broad variety of silicon-containing materials including without limitation silicon (including crystalline silicon), carbon-doped silicon (Si:C), silicon germanium, and carbon-doped silicon germanium (SiGe:C). As used herein, "carbon-doped silicon", "Si:C", "silicon germanium", "carbon-doped silicon germanium", "SiGe:C" and similar terms refer to materials that contain the indicated chemical elements in various proportions and, optionally, minor amounts of other elements. For example, "silicon germanium" is a material that comprises silicon, germanium and, optionally, other elements, for example, dopants such as carbon and electrically active dopants. Terms such as "Si:C" and "SiGe:C" are not stoichiometric chemical formulas per se and thus are not limited to materials that contain particular ratios of the indicated elements. Furthermore, terms such as Si:C and SiGe:C are not intended to exclude the presence of other dopants, such that a phosphorous and carbon-doped silicon material is included within the term Si:C and the term Si:C:P. The percentage of a dopant (such as carbon, germanium or electrically active dopant) in a silicon-containing film is expressed herein in atomic percent on a whole film basis, unless otherwise stated.

It is possible to determine the amount of carbon substitutionally doped into a silicon-containing material by measuring the perpendicular lattice spacing of the doped silicon-containing material by x-ray diffraction, then applying Vegard's Law by performing a linear interpolation between single crystal silicon and single crystal carbon (diamond). For example, it is possible to determine the amount of carbon substitutionally doped into silicon by measuring the perpendicular lattice spacing of the doped silicon by x-ray diffraction, and then applying Vegard's law. Additional details on this technique are provided in the Hoyt article. It is possible to determine the total carbon content in the doped silicon by secondary ion mass spectrometry ("SIMS"). It is possible to determine the non-substitutional carbon content by subtracting the substitutional carbon content from the total carbon content. It is possible to determine the amount of other elements substitutionally doped into other silicon-containing materials in a similar manner.

"Substrate," as that term is used herein, refers either to the workpiece upon which deposition is desired, or the surface exposed to one or more deposition gases. For example, in certain embodiments the substrate is a single crystal silicon wafer, a semiconductor-on-insulator ("SOI") substrate, or an epitaxial silicon surface, a silicon germanium surface, or a III-V material deposited upon a wafer. Workpieces are not limited to wafers, but also include glass, plastic, or other substrates employed in semiconductor processing. As discussed in U.S. Pat. No. 6,900,115, the entire disclosure of which is hereby incorporated by reference herein, a "mixed substrate" is a substrate that has two or more different types of surfaces. For example, in certain applications a mixed substrate comprises a first surface having a first surface morphology and a second surface having a second surface morphology. In certain embodiments, carbon-doped silicon-containing layers are selectively formed over single crystal semiconductor materials while minimizing, and more preferably avoiding, deposition over adjacent dielectrics or insulators. Examples of dielectric materials include silicon dioxide (including low dielectric constant forms such as carbon-doped and fluorine-doped oxides of silicon), silicon nitride, metal oxide and metal silicate. The terms "epitaxial", "epitaxially" "heteroepitaxial", "heteroepitaxially" and similar terms are used herein to refer to the deposition of a crystalline silicon-containing material onto a crystalline substrate in such a way that the deposited layer adopts or follows the lattice constant of the substrate. Epitaxial deposition is generally considered to be heteroepitaxial when the composition of the deposited layer is different from that of the substrate.

Even if surfaces are made from the same elements, the surfaces are considered different if the morphologies (crystallinity) of the surfaces are different. The processes described herein are useful for depositing silicon-containing films on a variety of substrates, but are particularly useful for mixed substrates having mixed surface morphologies. Such a mixed substrate comprises a first surface having a first surface morphology and a second surface having a second surface morphology. In this context, "surface morphology" refers to the crystalline structure of the substrate surface. Amorphous and crystalline are examples of different morphologies. Polycrystalline morphology is a crystalline structure that consists of a disorderly arrangement of orderly crystals and thus has an intermediate degree of order. The atoms in a polycrystalline material are ordered within each of the crystals, but the crystals themselves lack long range order with respect to one another. Single crystal morphology is a crystalline structure that has a high degree of long range order. Epitaxial films are characterized by a crystal structure and orientation that is identical to the substrate upon which they are grown, typically single crystal. The atoms in these materials are arranged in a lattice-like structure that persists over relatively long distances (on an atomic scale). Amorphous morphology is a non-crystalline structure having a low degree of order because the atoms lack a definite periodic arrangement. Other morphologies include microcrystalline and mixtures of amorphous and crystalline material. "Non-epitaxial" thus encompasses amorphous, polycrystalline, microcrystalline and mixtures of the same. As used herein, "single-crystal" or "epitaxial" are used to describe a predominantly large crystal structure having a tolerable number of faults therein, as is commonly employed for transistor fabrication. The crystallinity of a layer generally falls along a continuum from amorphous to polycrystalline to single-crystal; a crystal structure is often considered single-crystal or epitaxial, despite low density faults. Specific examples of mixed substrates include without limitation single crystal/polycrystalline, single crystal/amorphous, epitaxial/polycrystalline, epitaxial/amorphous, single crystal/dielectric, epitaxial/dielectric, conductor/dielectric, and semiconductor/dielectric. The term "mixed substrate" includes substrates having more than two different types of surfaces. Methods described herein for depositing silicon-containing films onto mixed substrates having two types of surfaces are also applicable to mixed substrates having three or more different types of surfaces.

When grown into recessed source/drain areas, tensile strained carbon-doped silicon films (Si:C films) provide a tensile strained silicon channel with enhanced electron mobility, particularly beneficial for NMOS devices. This advantageously eliminates the need to provide a relaxed silicon germanium buffer layer to support the strained silicon layer. In such applications, electrically active dopants are advantageously incorporated by in situ doping using dopant sources or dopant precursors. High levels of electrically active substitutional doping using phosphorous also contribute to tensile stress. Preferred precursors for electrical dopants are dopant hydrides, including n-type dopant precursors such as phosphine, arsenic vapor, and arsine. Silylphosphines, for example $(H_3Si)_{3-x}PR_x$, and silylarsines, for example, $(H_3Si)_{3-x}AsR_x$, where x=0, 1 or 2 and $R_x$=H and/or deuterium (D), are alternative precursors for phosphorous and arsenic dopants. Phosphor and arsenic are particularly useful for doping source and drain areas of NMOS devices. $SbH_3$ and trimethylindium are alternative sources of antimony and indium, respectively. Such dopant precursors are useful for the preparation of preferred films as described below, preferably boron-, phosphorous-, antimony-, indium-, and arsenic-doped silicon, Si:C, silicon germanium and SiGe:C films and alloys.

Selective Epitaxial Formation of Tensile Strained Si:C Films.

Techniques have now been developed for selectively forming a tensile strained Si:C film in exposed semiconductor windows, such as recessed source/drain regions of a mixed substrate. For example, it is possible to accomplish such selective formation by (a) blanket depositing a Si:C film over a mixed substrate using trisilane as a silicon precursor, and (b) selectively etching the resulting non-epitaxial layer that is formed over the insulator portion of the mixed substrate. Steps (a) and (b) are optionally repeated cyclically until a target epitaxial film thickness over the recessed source/drain regions is achieved.

It is possible to form recessed source/drain regions by dry etching with subsequent HF cleaning and in situ anneal. In embodiments wherein a dry etch is used, deposition of a selectively grown, thin (between approximately 1 nm and approximately 3 nm) silicon seed layer helps reduce etch damage. A seed layer also helps to cover damage caused by prior dopant implantation processes. In an example embodiment, such a seed layer might be selectively deposited using simultaneous provision of HCl and dichlorosilane at a deposition temperature between about 700° C. and about 800° C.

Figure 2:
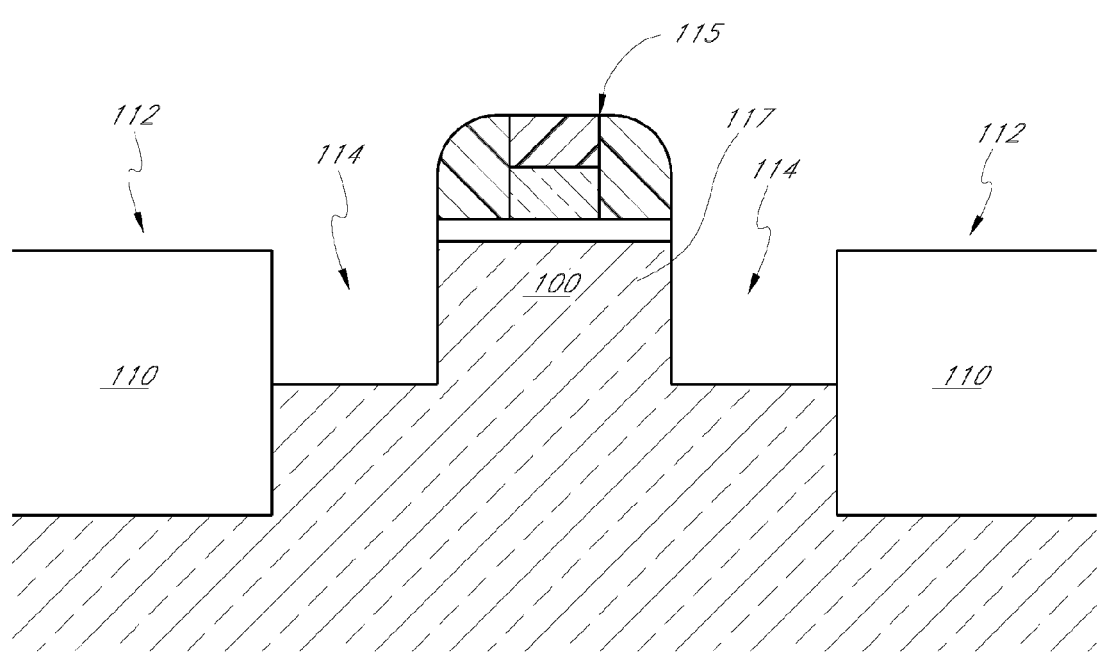
FIG. 2 is a schematic illustration of a partially formed semiconductor structure comprising patterned insulator regions formed in a semiconductor substrate.
Figure 5A:
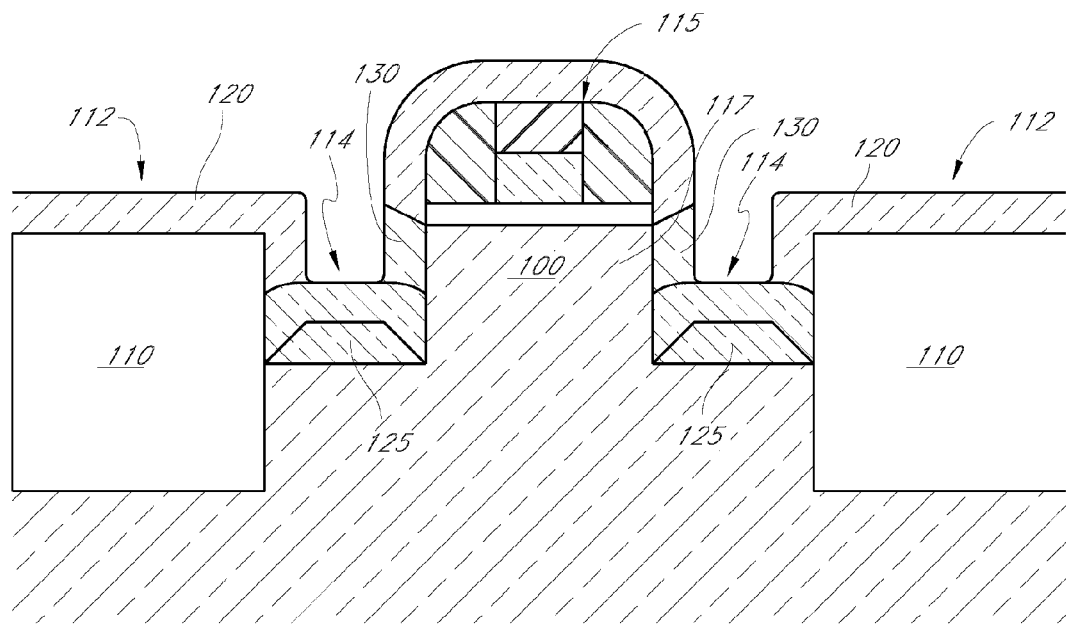
FIGS. 5A-5D are schematic illustrations of the partially formed semiconductor structure of FIG. 4 after performing further cycles of blanket deposition and selective etch.
Figure 5B:
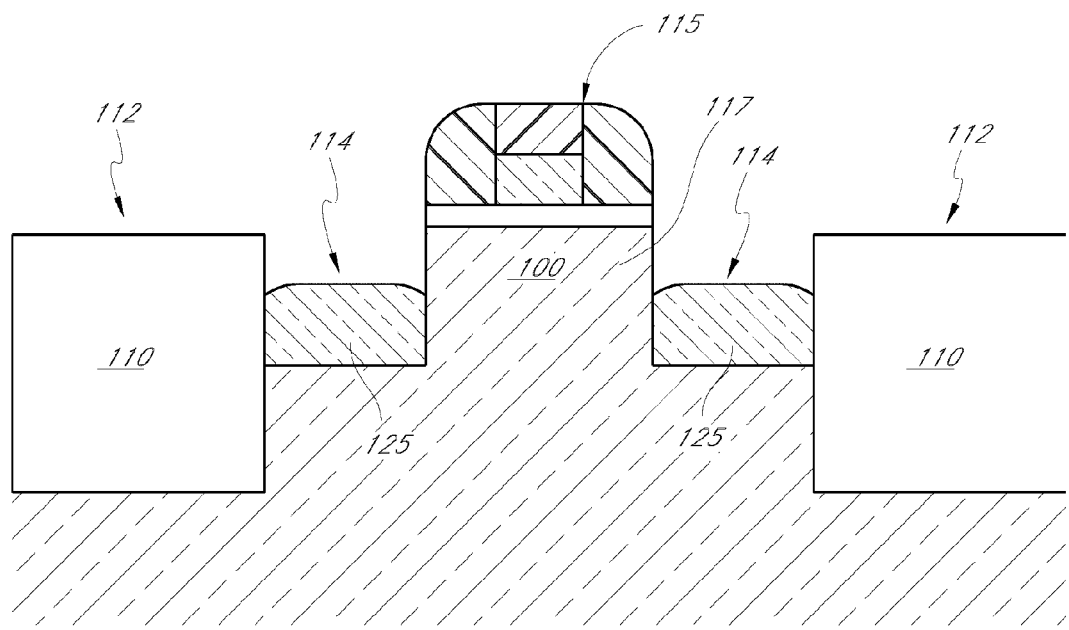
Figure 5C:
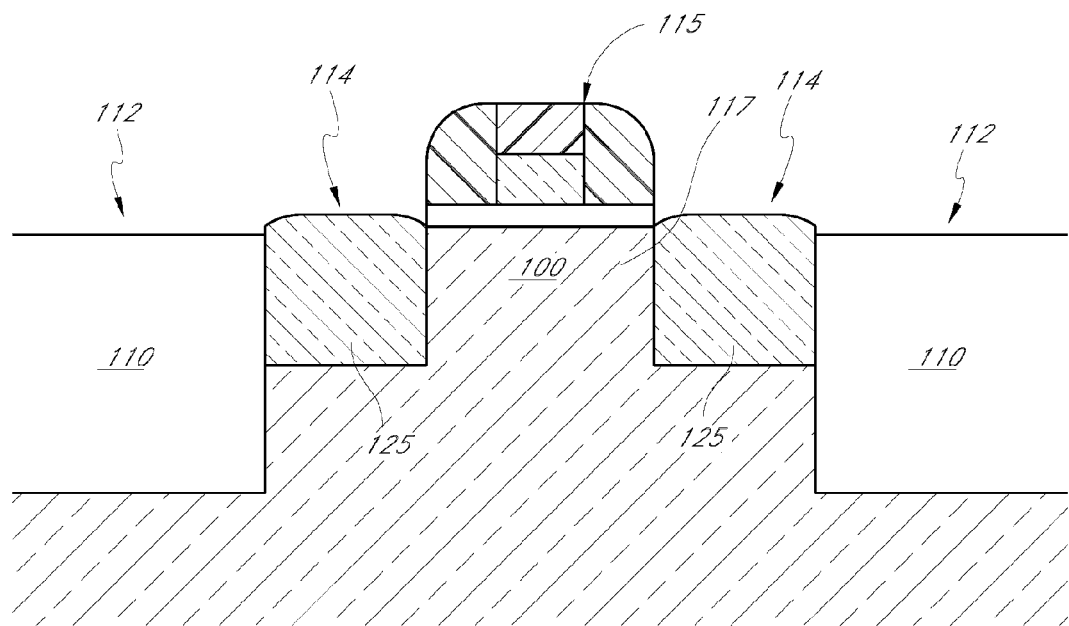
Figure 5D:
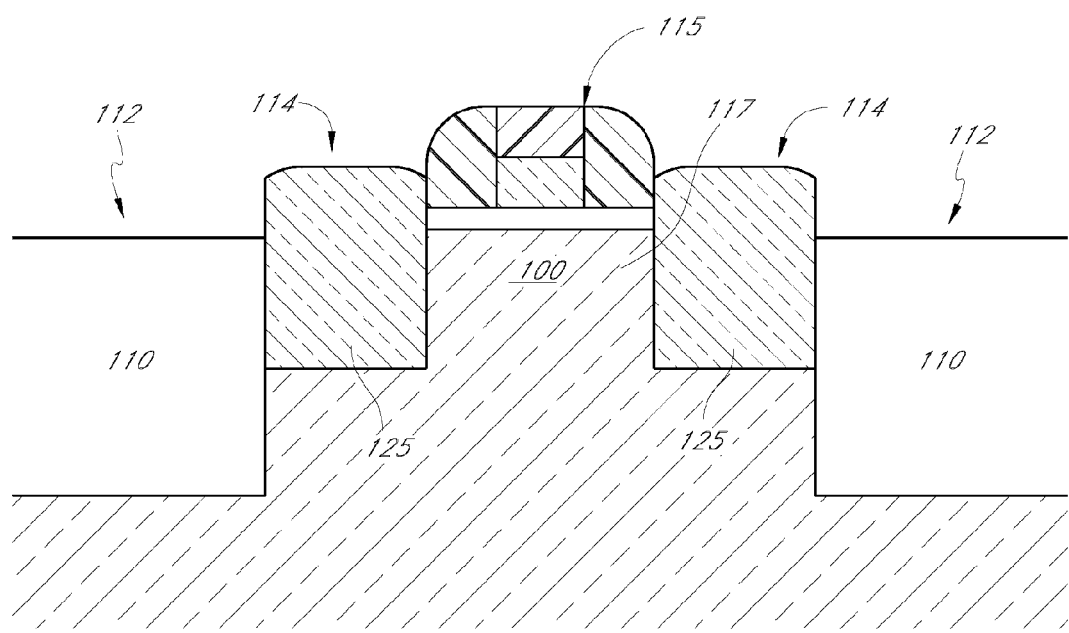

In accordance with preferred embodiments a cyclical blanket deposition and etch process is illustrated in the flowchart provided in FIG. 1, and in the schematic illustrations of the partially formed semiconductor structures illustrated in FIG. 2 though FIG. 5D. While illustrated for use with Si:C deposition in recessed source/drain regions, it will be appreciated that the techniques described herein are advantageous for selective formation of epitaxial films in other circumstances, such as on active area islands surrounded by field isolation prior to any gate definition and without recessing.

In particular, FIG. 1 illustrates that a mixed substrate having insulator regions and recessed source/drain regions is placed in a process chamber in operational block 10. FIG. 2 provides a schematic illustration of an exemplary mixed substrate that includes a patterned insulator 110 formed in a semiconductor substrate 100, such as a silicon wafer. The illustrated insulator 110, in the form of oxide-filled shallow trench isolation (STI), defines field isolation regions 112 and is adjacent recessed source/drain regions 114 shown on either side of a gate electrode 115 structure. Note that the gate electrode 115 overlies a channel region 117 of the substrate. Together, the channel 117, source and drain regions 114 define a transistor active area, which is typically surrounded by field isolation 112 to prevent cross-talk with adjacent devices. In other arrangements, multiple transistors can be surrounded by field isolation. In one case, the top of the gate structure 115, can be capped with dielectric, as illustrated. This surface then behaves similarly to the field regions 110 with respect to the deposition there over, and the conditions that maintain selectivity in the field region will also apply to the top of the gate. In the case that that the gate 115 is not capped with a dielectric, then the surface of the gate has the potential to grow polycrystalline material which then can be removed through in-situ etching of polycrystalline material, but a different set of selectivity conditions (pressure, gas flow, etc) would apply, compared to those used to ensure no residual polycrystalline material on the field 110.

Figure 3:
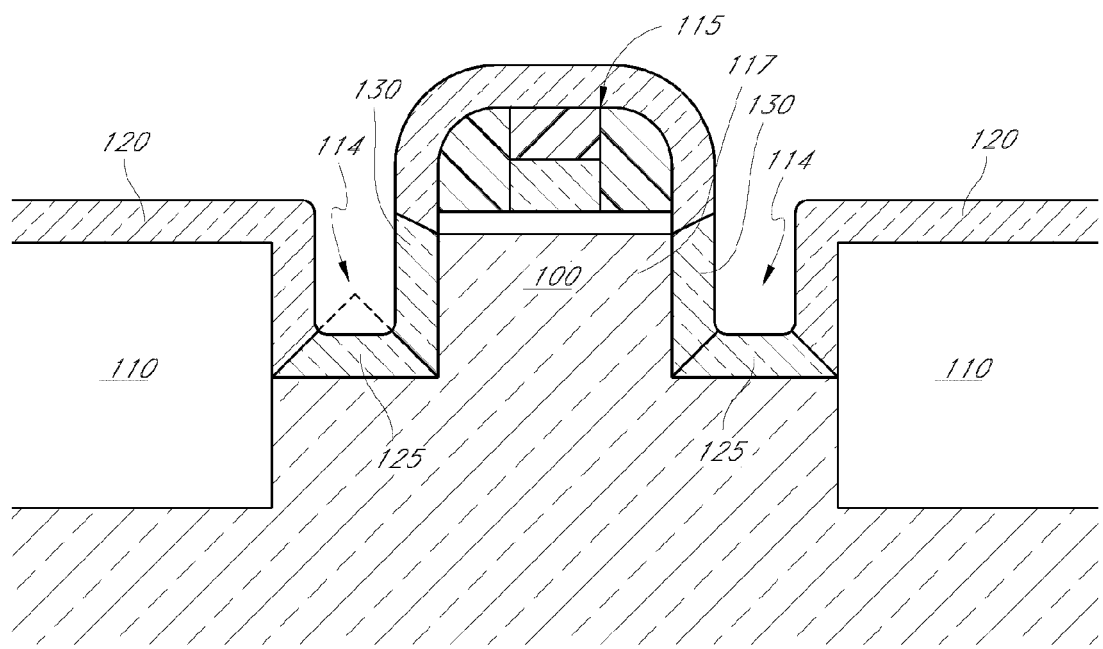
FIG. 3 is a schematic illustration of the partially formed semiconductor structure of FIG. 2 after performing a blanket deposition of a carbon-doped silicon film over the mixed substrate surface.

As indicated by operational block 20 in FIG. 1, and as illustrated schematically in FIG. 3, a blanket Si:C layer is then deposited over the mixed substrate using trisilane as a silicon precursor. This results in amorphous or polycrystalline (non-epitaxial) deposition 120 over oxide regions 112, and lower epitaxial deposition 125 and sidewall epitaxial deposition 130 over the recessed source/drain regions 114. Note that "blanket deposition" means that net deposition results over both the amorphous insulator 110 and the single crystal regions 114 in each deposition phase. While lack of etchant (e.g., lack of halides) is preferred in the blanket deposition, in which case the deposition can also be considered "non-selective," some amount of etchant might be desirable to tune the ratio of deposited thickness over the various regions, as discussed in more detail below. In case such small amounts of etchant are desirable, the deposition process may be partially selective but nevertheless blanket, since each deposition phase will have net deposition over both the insulator 110 and single crystal region 114.

Figure 4:
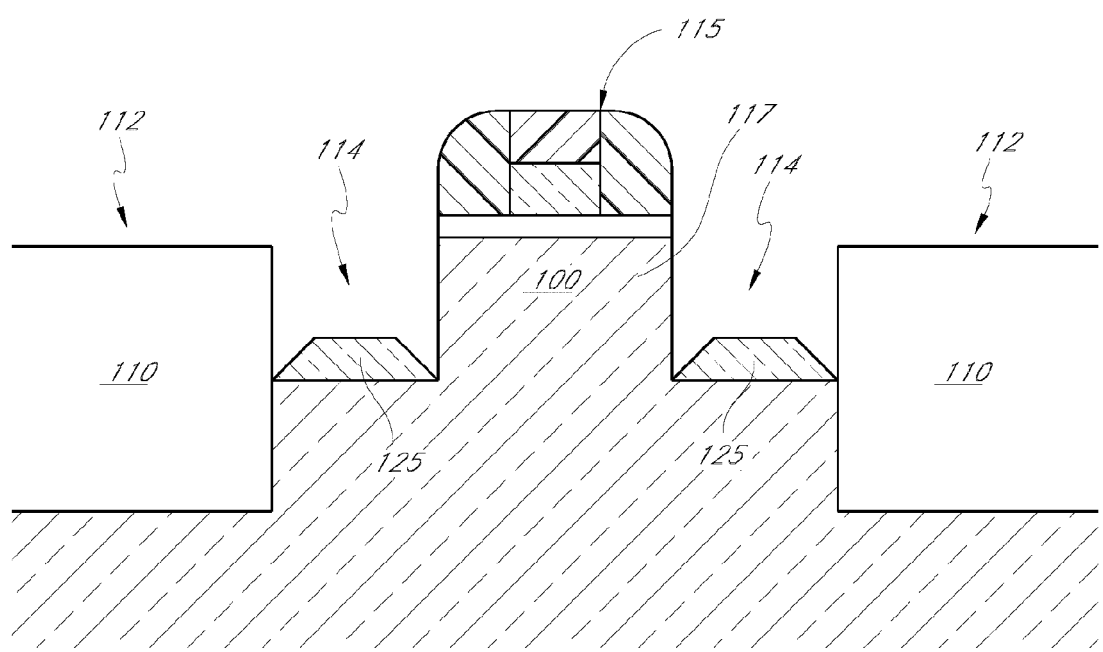
FIG. 4 is a schematic illustration of the partially formed semiconductor structure of FIG. 3 after performing a selective chemical vapor etch process to remove carbon-doped silicon from oxide regions of the mixed substrate.

The regions of amorphous or polycrystalline deposition 120 and the sidewall epitaxial deposition 130 are then selectively etched in an operational block 30 (FIG. 1), thus resulting in the structure that is schematically illustrated in FIG. 4. Preferably, little or no epitaxially deposited Si:C is removed from the lower epitaxial layer 125 in the recessed source/drain regions 114 during the selective etch. As discussed in more detail below, the vapor etch chemistry preferably comprises a halide (e.g., fluorine-, bromine- or chlorine-containing vapor compounds), and particularly a chlorine source, such as HCl $Cl_2$. More preferably the etch chemistry also contains a germanium source (e.g., a germane such as monogermane ($GeH_4$), $GeCl_4$, metallorganic Ge precursors, solid source Ge) to improve etch rates. At the same time that the non-epitaxial material 120 is selectively removed, some epitaxial material is left and some is removed. The sidewall epitaxial layer 130 is of a different plane and is also more defective (due to growth rate differential on the two surfaces) than the lower epitaxial layer 125. Accordingly, the sidewall epitaxial layer 130 is more readily removed, along with the non-epitaxial material 120. Thus, each cycle of the process can be tuned to achieve largely bottom-up filling of the recesses 114. In some arrangements, epitaxial material can be left by the process even on the sidewalls if it is of good quality and does not hinder the goals of the selective fill.

This process is repeated until a target thickness of epitaxial Si:C film thickness is achieved over the recessed source/drain regions 114, as indicated by decisional block 40 (FIG. 1), and as schematically illustrated in FIG. 5A (deposition of second cycle of blanket Si:C layer 120) and FIG. 5B (etch of second cycle of Si:C layer to leave layer of epitaxial Si:C with increased thickness of epitaxial layer 125 in recessed source/drain regions 114). FIG. 5C illustrates the result of further cycle(s) to leave epitaxial refilled source/drain regions 114, where the selective epitaxial layers 125 are roughly coplanar with field oxide 110. FIG. 5D illustrates the result of further cycle(s) to leave epitaxial layers 125 selectively as elevated source/drain regions 114.

The selective formation process may further include addition cycles of blanket deposition and selective etch back from over dielectric regions, but without carbon doping to form a capping layer. The capping layer can be with or without electrical dopants. For example, the portion of the elevated source/drain regions 125 of FIG. 5D that is above the original substrate surface (i.e., above the channel 117) can be carbon-free, since it does not contribute to the strain on the channel 117.

In an example embodiment, the deposited Si:C film optionally includes an electrically active dopant, particularly one suitable for NMOS devices, such as phosphorous or arsenic, thereby allowing phosphorous-doped Si:C films or arsenic doped Si:C films to be deposited (Si:C:P or Si:C:As films, respectively). The Si:C film is preferably deposited with an amorphous-to-epitaxial growth rate ratio that is preferably between about 1.0:1 and about 1.6:1, more preferably between about 1.0:1 and about 1.3:1, and most preferably between about 1.0:1 and about 1.1:1, such that the film thickness over insulator and over the recessed source/drain regions is about equal. Manipulating the amorphous (or more generally non-epitaxial) to epitaxial growth rate ratio advantageously enables manipulation of the facet angle at the interface between the amorphous and crystalline Si:C after the subsequent etch process, and also minimizes etch duration for removal, relative to greater thicknesses over the insulators. Preferably the amorphous regions of the Si:C deposition have little or no crystallinity (i.e., are predominantly amorphous), thus facilitating the subsequent etch in such regions. Furthermore, minimizing the excess of non-epitaxial deposition by bringing the ratio of thickness close to 1:1 reduces the length of the etch phase needed to clear non-epitaxial deposition from the field regions (and optionally from the gate).

In a preferred embodiment, the Si:C film is selectively etched from the mixed substrate using an in situ chemical vapor etching technique. The chemical vapor etching technique is optionally performed simultaneously with a brief temperature spike. In one embodiment, the temperature spike is conducted using the process described in U.S. Patent Application Publication 2003/0036268 (filed 29 May 2002). As described therein, using a single wafer epitaxial deposition tool with radiant heating through cold quartz or otherwise transparent walls, a temperature spike can employ full power to the upper lamps for a short duration (for example, for about 12 to about 15 seconds) while decoupling the power ratio for the lower lamps. In this way, the wafer temperature can rapidly ramp up while the susceptor temperature lags significantly. The wafer temperature preferably increases from the loading temperature by between about 100° C. and about 400° C., and more preferably by between about 200° C. and about 350° C. Because of the short duration of the temperature spike and etch phase, the wafer is allowed to cool before the susceptor gets a chance to approach the peak temperature. In this way, it takes far less time for the wafer to cycle in temperature, as compared to simultaneously cycling the temperature of a more massive combination of wafer/susceptor together. An example reactor for use with this temperature spike technique is the EPSILON® series of single wafer epitaxial chemical vapor deposition chambers, which are commercially available from ASM America, Inc. (Phoenix, Ariz.).

However, in another embodiment, to aid in maintaining high concentrations of substitutional carbon and electrically active dopants, while at the same time minimizing temperature ramp/stabilization times, the etch temperature is preferably kept low. Using a low temperature for the etch also reduces the likelihood that electrically active dopant atoms are deactivated during the etch. For example, etching with $Cl_2$ gas advantageously allows the etch temperature to be reduced, thus helping to maintain the substitutional carbon and electrically active dopants.

Low temperatures for the etch phase enables roughly matching deposition phase temperatures while taking advantage of the high dopant incorporation achieved at low temperatures. Etch rates can be enhanced to allow these lower temperatures without sacrificing throughput by including a germanium source (e.g. $GeH_4$ $GeCl_4$, metallorganic Ge precursors, solid source Ge) during the etch phase instead of flash ramping the temperature to improve throughput.

"Isothermal" cyclical blanket deposition and etching, as used herein, means deposition and etching within ±50° C. of one another, preferably within ±10° C., and most preferably setpoint temperature is within ±5° C. for both steps. Advantageously, isothermal processing improves throughput and minimizes time for temperature ramping and stabilization. Similarly, both blanket deposition and etching process are preferably "isobaric," i.e., within ±50 Torr of one another, preferably within ±20 Torr. Isothermal and/or isobaric conditions facilitate better throughput for avoiding ramp and stabilization times.

As illustrated in FIG. 1, the two-stage process of performing a blanket deposition followed by a selective etch is optionally repeated cyclically until a target epitaxial film thickness over the recessed source/drain regions is achieved. Example process parameters are summarized in Table A below, which lists both preferred operating points as well as preferred operating ranges in parentheses. As is evident from Table A, the process conditions—such as chamber temperature, chamber pressure and carrier gas flow rates—are preferably substantially similar for the deposition and the etch phases, thereby allowing throughput to be increased. Thus, the example below employs isothermal and isobaric conditions for both phases of the cycle. Other parameters are used in modified embodiments.

TABLE A

| TABLE A | stabilize chamber temp and atmosphere | pre-deposit | Deposit | post-deposit purge of process gases | pre-bake etchant stabilize | flash-bake temp spike (optional) | post-bake cool and temp stabilize |
|---|---|---|---|---|---|---|---|
| time (sec) | | 5 (2.5-7.5) | 15 (5-20) | 5 (2.5-7.5) | 5 (2.5-7.5) | 6.5 (3.0-10) | 12.5 (10-15) |
| temp (° C.) | 550 (500-650) | 550 (500-650) | 550 (500-650) | 550 (500-650) | 550 (500-650) | temp spike | 550 (500-650) |
| pressure (Torr) | 64 (50-200) | 64 (50-200) | 64 (50-200) | 64 (50-200) | 64 (50-200) | 64 (50-200) | 64 (50-200) |
| $H_2$/He (slm) | 2.0 (0.5-20) | 2.0 (0.5-20) | 2.0 (0.5-20) | 2.0 (0.5-20) | 2.0 (0.5-20) | 2.0 (0.5-20) | 2.0 (0.5-20) |
| $Cl_2$/HCl (sccm) | | | | | 200 (5-1000) | 200 (5-1000) | 200 (5-1000) |
| $Si_3H_8$ (mg/min) | | 75 (50-200) | 75 (50-200) | 75 (50-200) | | | |
| $CH_3SiH_3$ (sccm) | | 150 (10-300) | 150 (10-300) | 150 (10-300) | | | |
| $PH_3$ (sccm) | | 50 (10-200) | 50 (10-200) | 50 (10-200) | | | |

Using the parameters provided in Table A, it is possible to achieve net growth rates that are preferably between about 4 nm min$^{-1}$ and about 11 nm min$^{-1}$, and more preferably between about 8 nm min$^{-1}$ and about 11 nm min$^{-1}$, for epitaxial Si:C:P films that are selectively deposited in recessed source/drain regions. It is also possible to achieve thin Si:C:P films with substitutional carbon content up to 3.6% as determined by Vegard's Law, and with resistivities between about 0.4 mΩ cm and about 2.0 mΩ cm. By manipulating the deposition conditions, it is possible to obtain other film properties.

During the etch process disclosed herein, epitaxial Si:C is etched significantly slower than amorphous or polycrystalline Si:C in each etch phase (etch selectivity in the range of 10:1-30:1). Defective epitaxial material is also preferentially removed in the etch phases. In a preferred embodiment, the cyclical deposition and etch process conditions are tuned to reduce or eliminate net growth on the oxide while achieving net growth in each cycle in the epitaxial recessed source/drain regions. This cyclical process is distinguishable from conventional selective deposition processes in which deposition and etching reactions occur simultaneously.

Tables B and C below give two examples of deposition and etch durations and resultant thicknesses using a recipe similar to that of Table A. The recipes are differently tuned to modulate both deposition and etch rates by increasing the partial pressure of the $Si_3H_8$ and optimizing etchant partial pressures.

TABLE B

| | Deposition Phase | | Etch Phase |
|---|---|---|---|
| Growth rate [nm/min] | 28 | 13 | α-etch rate [nm/min] |
| Deposition time[s] | 22 | 47.4 | Minimum etch time[s] |
| | | 60 | % overetch |
| | | 75.8 | Effective etch time[s] |
| Deposited α-thickness [nm] | 10.27 | 16.43 | Removed α thickness [nm] |
| Deposited epi-thickness [nm] per deposition step | 9.78 | 0.82 | Removed c thickness [nm] per etch step |

TABLE B-continued

| | Deposition Phase | | Etch Phase |
|---|---|---|---|
| α/epi growth rate ratio | 1.05 | 20 | In-situ etch selectivity |
| Purge (pre epi + post epi) [s] | 25 | 25 | Purge (pre epi + post epi) [s] |
| Final time/cycle[s] | 122.8 | | |
| Final thk/cycle [nm] | 8.96 | | |
| Average growth rate [nm/min] | 4.38 | | |

TABLE C

| | Deposition Phase | | Etch Phase |
|---|---|---|---|
| Growth rate [nm/min] | 80 | 25 | Etch rate [nm/min] |
| Deposition time[s] | 8 | 25.6 | Minimum etch time[s] |
| | | 30 | % overetch |
| | | 33.28 | Effective etch time[s] |
| Deposited α-thickness [nm] | 10.67 | 13.87 | Removed α thickness [nm] |
| Deposited epi-thickness [nm] per deposition step | 10.67 | 0.693 | Removed c thickness [nm] per etch step |
| α/epi growth rate ratio | 1 | 20 | In-situ etch selectivity |
| Purge (pre epi + post epi) [s] | 20 | 20 | Purge (pre epi + post epi) [s] |
| Final time/cycle[s] | 61.3 | | |
| Final thk/cycle [nm] | 9.977 | | |
| Average growth rate [nm/min] | 9.76 | | |

The process parameters provided in Table A indicate a $Cl_2$/HCl etch chemistry. In a modified embodiment, between about 20 sccm and about 200 sccm of 10% $GeH_4$ is included in the etch chemistry as an etch catalyst. In certain embodiments, inclusion of a germanium source (e.g., a germane such as $GeH_4$, $GeCl_4$, metalorganic Ge precursors, solid source Ge) in the etch chemistry advantageously enhances the etch rate and the etch selectivity. In addition, use of germanium as a catalyst also advantageously allows lower etch temperatures to be used, and allows a temperature spike during etch to be omitted, as noted above in discussion of isothermal processing. Additional information regarding diffusion of germanium in amorphous, polycrystalline and single crystalline silicon and the subsequent etching of Ge rich silicon materials is provided in the literature; see for example, Mitchell et al., "Germanium diffusion in polysilicon emitters of SiGe heterojunction bipolar transistors fabricated by germanium implantation", *J. of Appl. Phys*, 92(11), pp. 6924-6926 (1 Dec. 2002), Wu et al., "Stability and mechanism of selective etching of ultrathin Ge films on the Si(100) surface," *Phys. Rev. B*, 69 (2004), and Bogumilowicz et al., "Chemical vapour etching of Si, SiGe and Ge with HCl; applications to the formation of thin relaxed SiGe buffers and to the revelation of threading dislocations upon chlorine adsorption," *Semicond. Sci. & Tech.*, no. 20, pp. 127-134, (2005).

Figure 6:
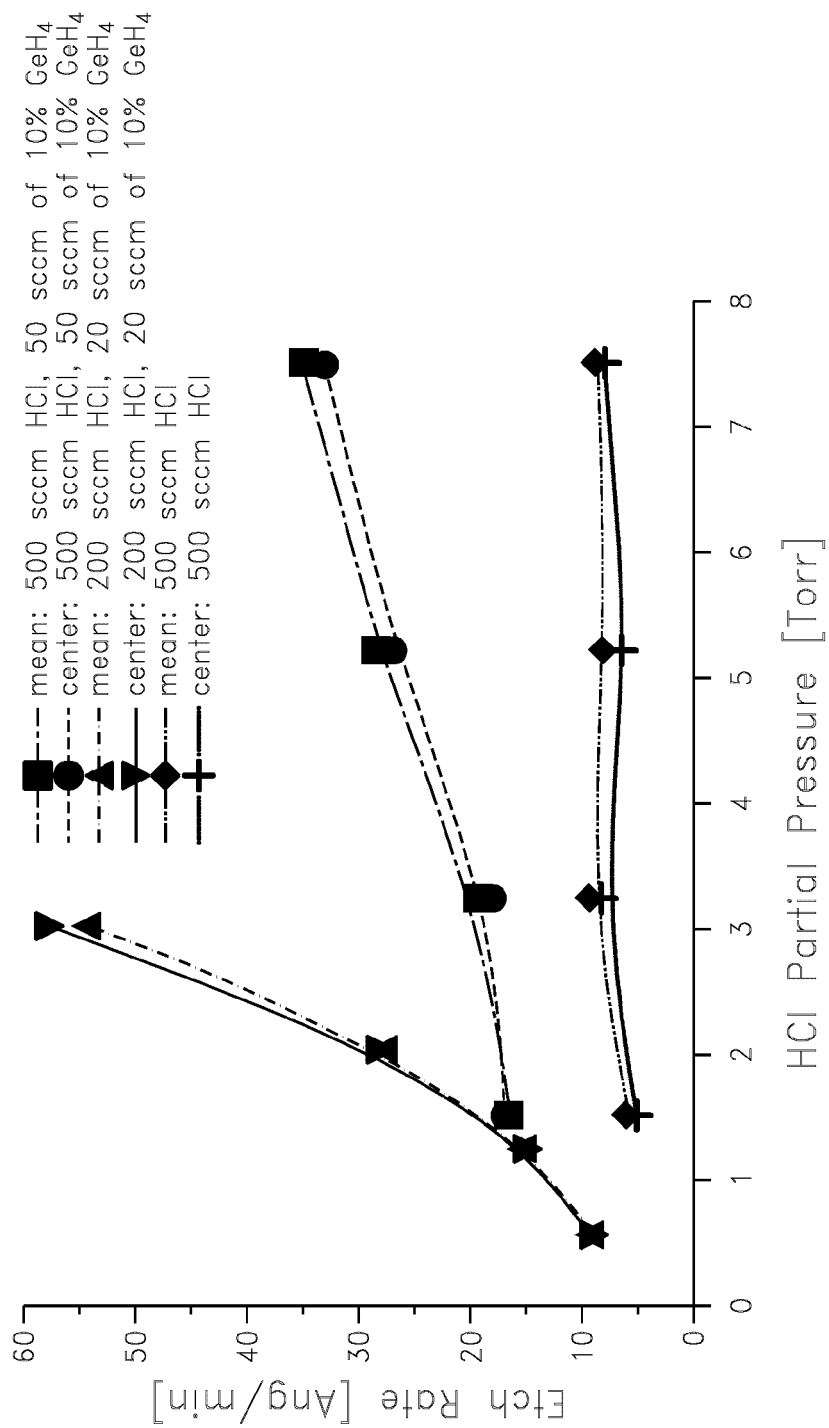
FIG. 6 shows a graph of etch rate of amorphous regions of a carbon-doped silicon film as a function of HCl partial pressure in the etch chemistry.

FIG. 6 shows a graph of etch rate of amorphous regions of a carbon-doped silicon film as a function of HCl partial pressure in the etch chemistry, at a constant temperature of 600° C. By decreasing the $H_2$ carrier flow, the partial pressure of HCl and $GeH_4$ is increased, thereby significantly increasing the amorphous etch rate in certain embodiments. For example, FIG. 6 indicates that inclusion of 20 sccm of 10% $GeH_4$ in the etch chemistry (symbols ▼ and ▲) results in substantially higher amorphous etch rates.

Figure 7:
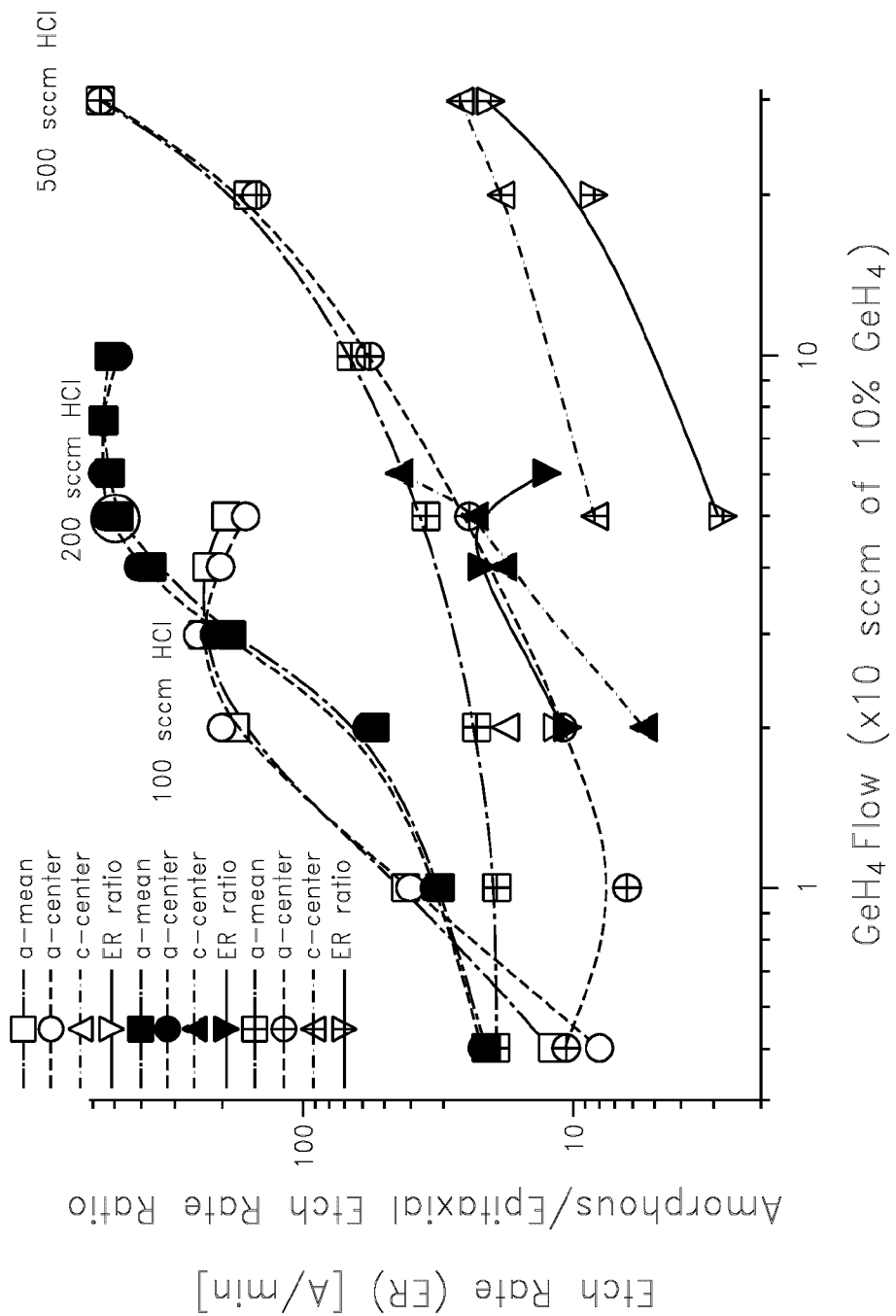
FIG. 7 shows a graph of etch rates and ratios amorphous ("a") and single crystal ("c") etch rates as a function of $GeH_4$ flow in the etch chemistry for various etch chemistries.

FIG. 7 shows a graph of etch rate and amorphous/epitaxial etch rate ratio as a function of $GeH_4$ flow in the etch chemistry, at a constant temperature of 600° C., a constant $H_2$ carrier flow of 2 slm, and a constant chamber pressure of 64 Torr. Amorphous etch rates are indicated by the "a-" prefix in the legend, epitaxial etch rates are indicated by the "c-" prefix in the legend, and etch rate ratios are indicated by "ER" in the legend. Increasing the $GeH_4$ flow causes the amorphous/epitaxial etch rate ratio to increase to a point, beyond which additional $GeH_4$ reduces etch selectivity. For example, FIG. 7 indicates that an etch chemistry comprising 200 sccm HCl and approximately 30 to 40 sccm of 10% $GeH_4$ produces an amorphous/epitaxial etch rate ratio that cannot be obtained with lower or higher $GeH_4$ flow rates.

Figure 8:
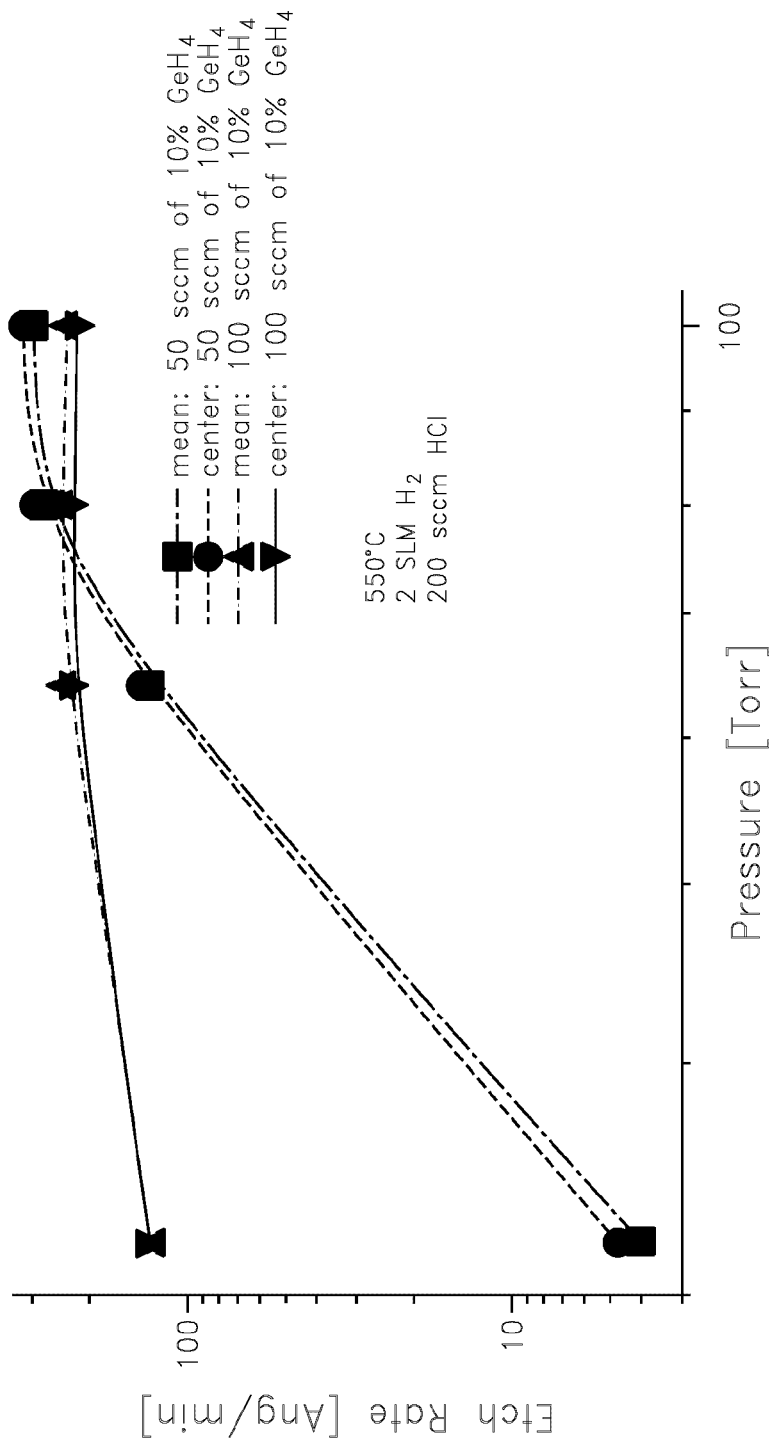
FIG. 8 shows a graph of etch rate of amorphous regions of a carbon-doped silicon film as a function of chamber pressure.

FIG. 8 shows a graph of etch rate of amorphous regions of a Si:C film as a function of chamber pressure for various $GeH_4$ flow rates in the etch chemistry, at a constant temperature of 550° C., a constant $H_2$ carrier flow of 2 slm, and a constant HCl etchant flow of 200 sccm. By increasing the chamber pressure beyond approximately 80 Torr, the dependence of the etch rate on the $GeH_4$ flow rate is reduced. However, by increasing the chamber pressure from about 64 Torr to about 80 Torr when 50 sccm of 10% $GeH_4$ is included in the etch chemistry, the amorphous etch rate is increased by a factor of about two.

Figure 9:
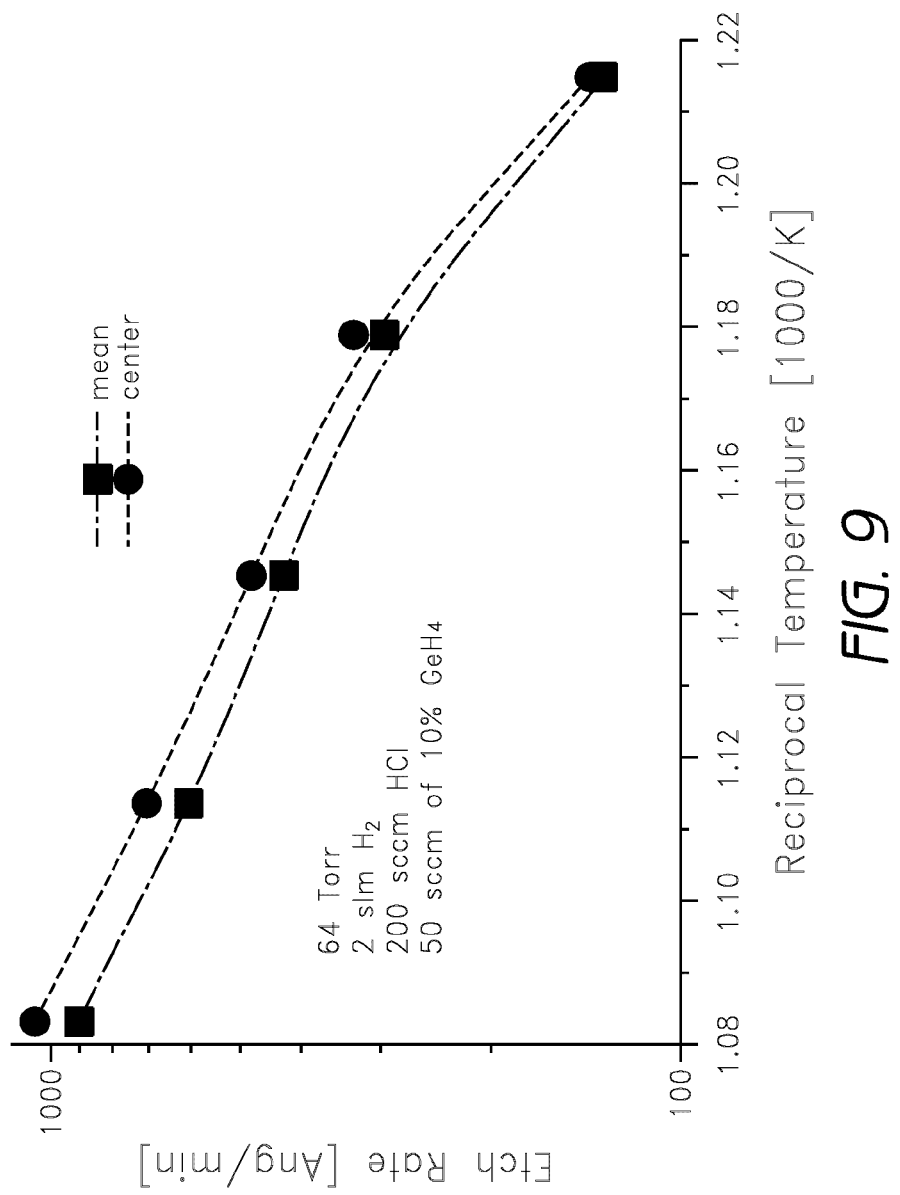
FIG. 9 shows a graph of etch rate of amorphous regions of a carbon-doped silicon film as a function of reciprocal temperature.

FIG. 9 shows a graph of etch rate of amorphous regions of a carbon-doped silicon film as a function of reciprocal temperature, at a constant chamber pressure of 64 Torr, a constant $H_2$ carrier flow of 2 slm, a constant HCl etchant flow of 200 sccm, and a constant $GeH_4$ etchant flow of 50 sccm of 10% $GeH_4$. The absolute etch rates are very high for these chemicals even at very low temperatures.

Figure 10:
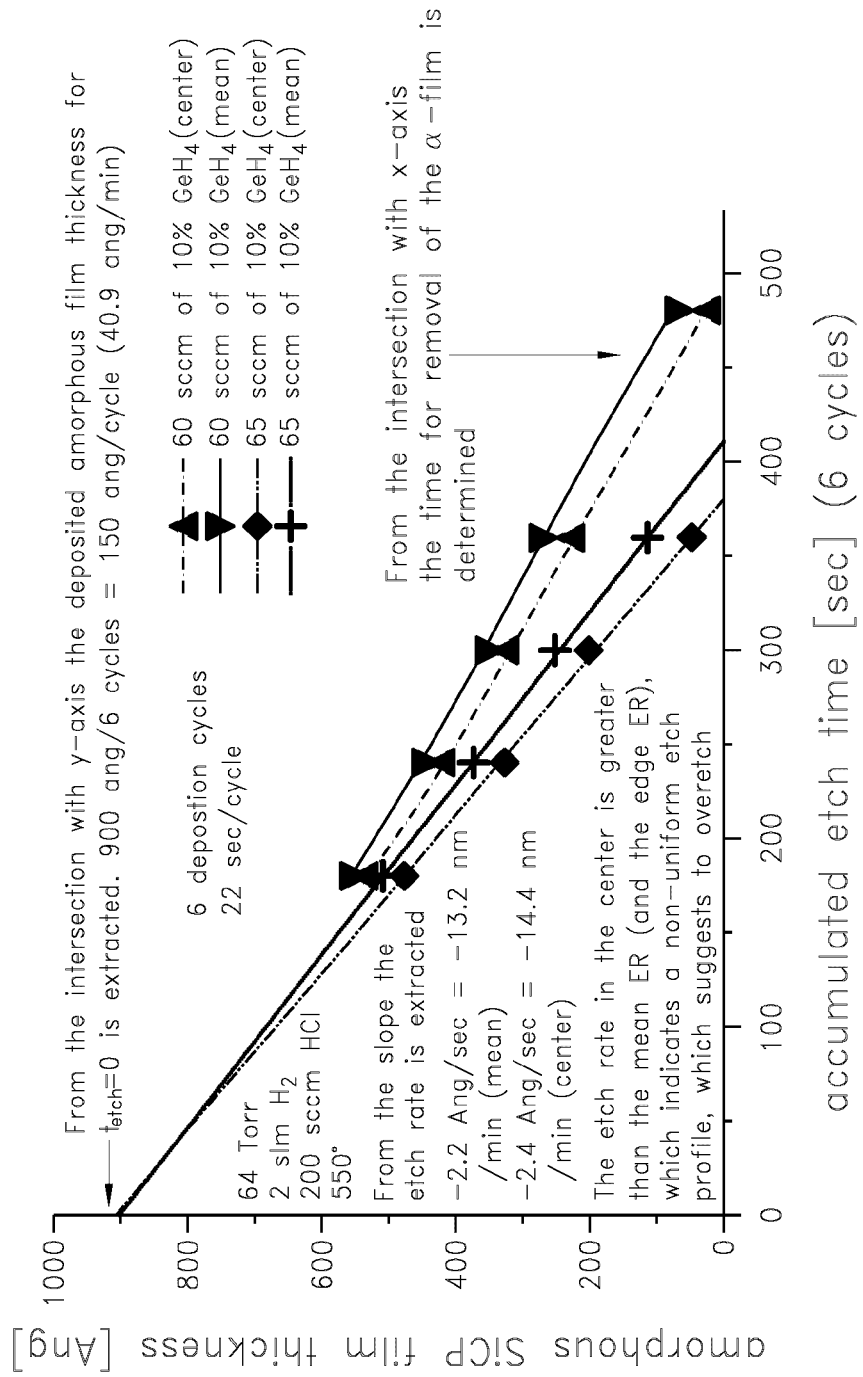
FIG. 10 shows a graph of thickness of amorphous regions of a carbon-doped silicon film as a function of accumulated etch time.

FIG. 10 shows a graph of thickness of amorphous regions of a carbon-doped silicon film as a function of accumulated etch time, at a constant chamber pressure of 64 Torr, a constant chamber temperature of 550° C., a constant $H_2$ carrier flow of 2 slm, and a constant HCl etchant flow of 200 sccm. The slopes of the lines plotted in FIG. 10 correspond to the etch rate of the amorphous Si:C film. As indicated, the etch rate in the center of the deposited film is greater than the etch rate at the edge of the deposited film. Therefore, in a preferred embodiment the wafer is "overetched" to increase the likelihood that amorphous Si:C is removed from the slower-etching wafer edges. By extrapolating the lines plotted in FIG. 10 to the y-axis, it is possible to estimate the initial amorphous film thickness and growth rate. Likewise, by extrapolating the lines plotted in FIG. 10 to the x-axis, it is possible to estimate the time required to etch the amorphous material entirely. FIG. 10 illustrates that an etch rate of approximately 140 Å $min^{-1}$ is obtained with the provided process parameters.

Figure 11:
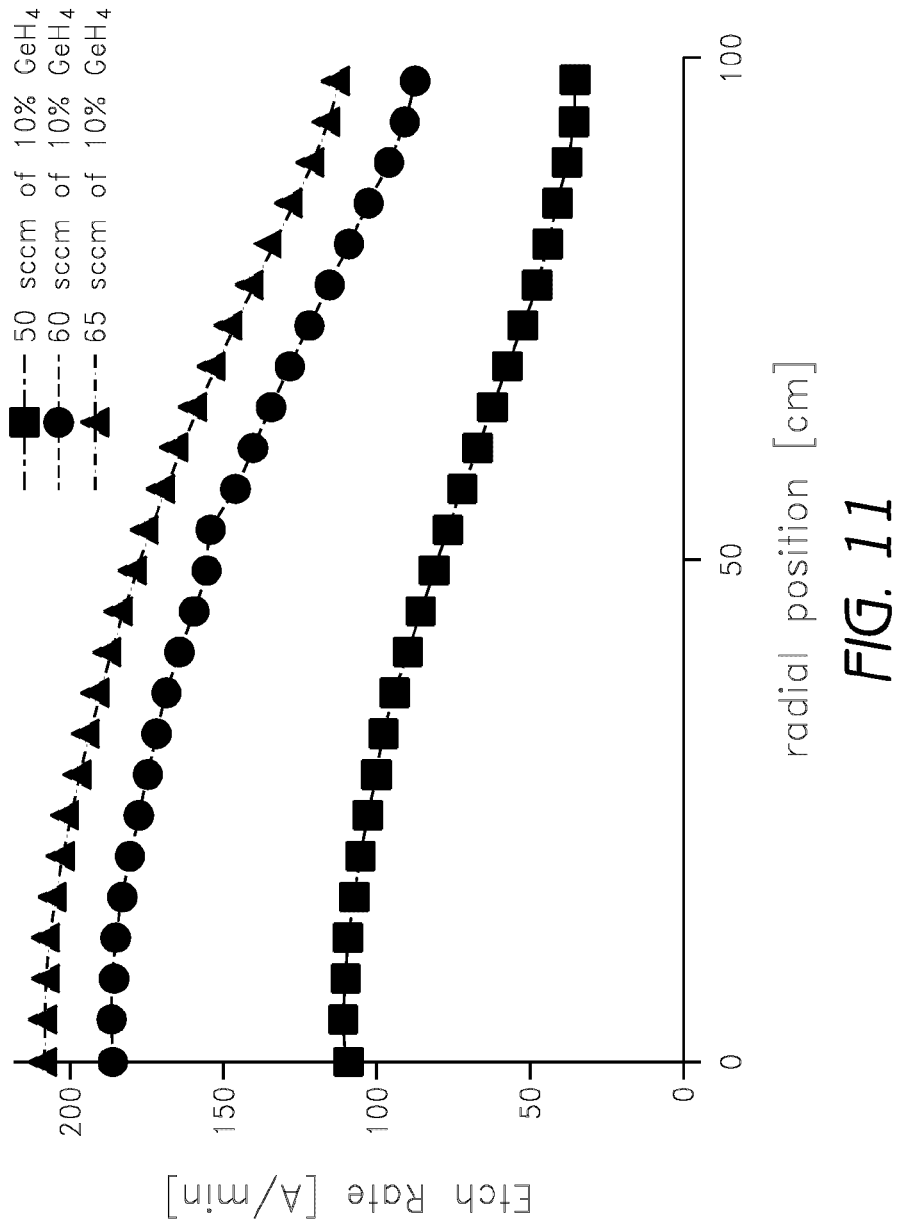
FIG. 11 shows a graph of etch rate of amorphous regions of a carbon-doped silicon film deposited on a wafer as a function of radial position on the wafer.

FIG. 11 shows a graph of etch rate of amorphous regions of a carbon-doped silicon film deposited on a wafer as a function of radial position on the wafer, at a constant chamber temperature of 550° C., a constant chamber pressure of 64 Torr, a constant $H_2$ carrier flow of 2 slm, and a constant HCl etchant flow of 200 sccm. FIG. 11 indicates that the etch rate is slightly slower at the wafer edge than the wafer center.

Figure 12:
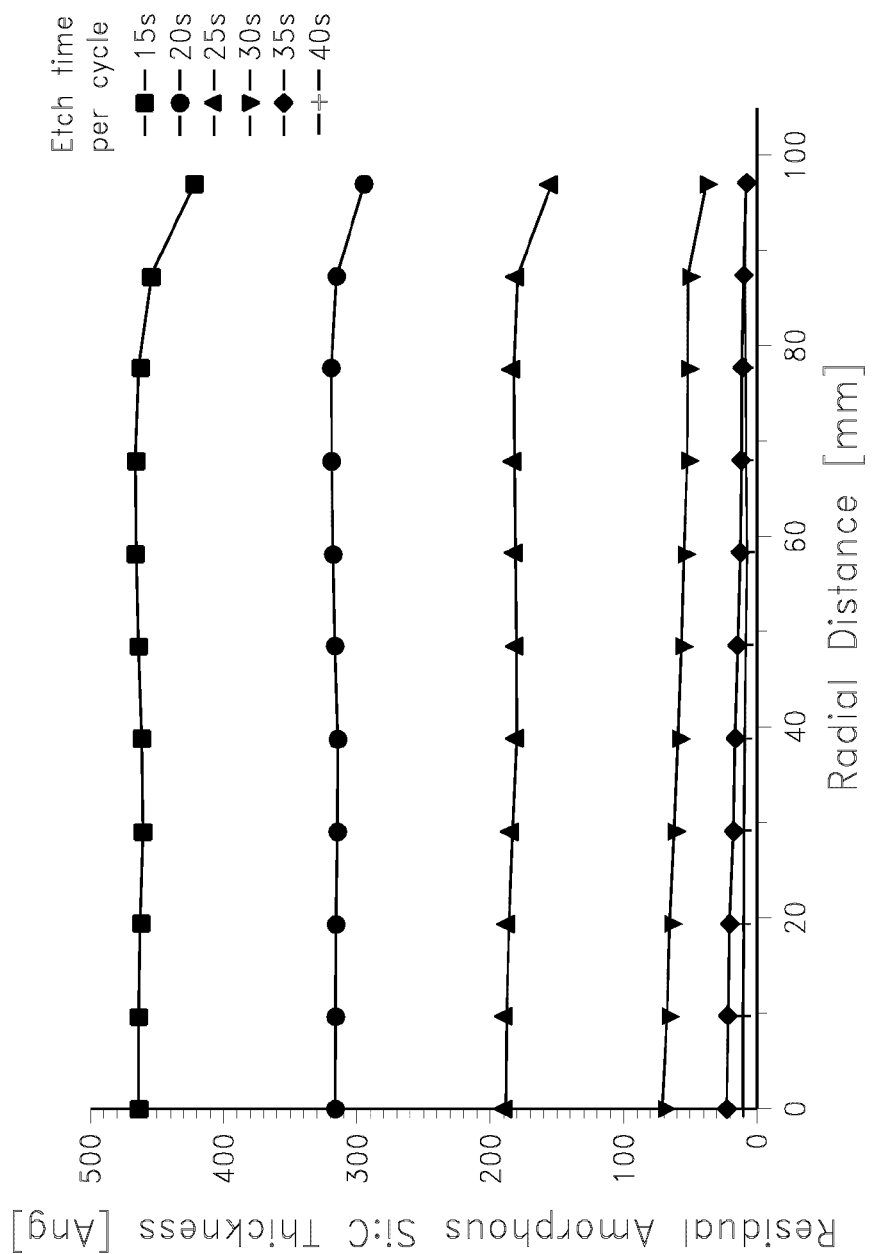
FIG. 12 shows a graph of thickness of amorphous regions of a carbon-doped silicon film deposited on a wafer as a function of radial position on the wafer for various etch cycle durations.

FIG. 12 shows a graph of thickness of amorphous regions of a carbon-doped silicon film deposited on a wafer as a function of radial position on the wafer for various etch cycle durations, at a constant chamber temperature of 550° C., a constant chamber pressure of 80 Torr, a constant $H_2$ carrier flow of 2 slm, a constant HCl etchant flow of 200 sccm, and a constant $GeH_4$ etchant flow of 6.5 sccm.

Figure 13:
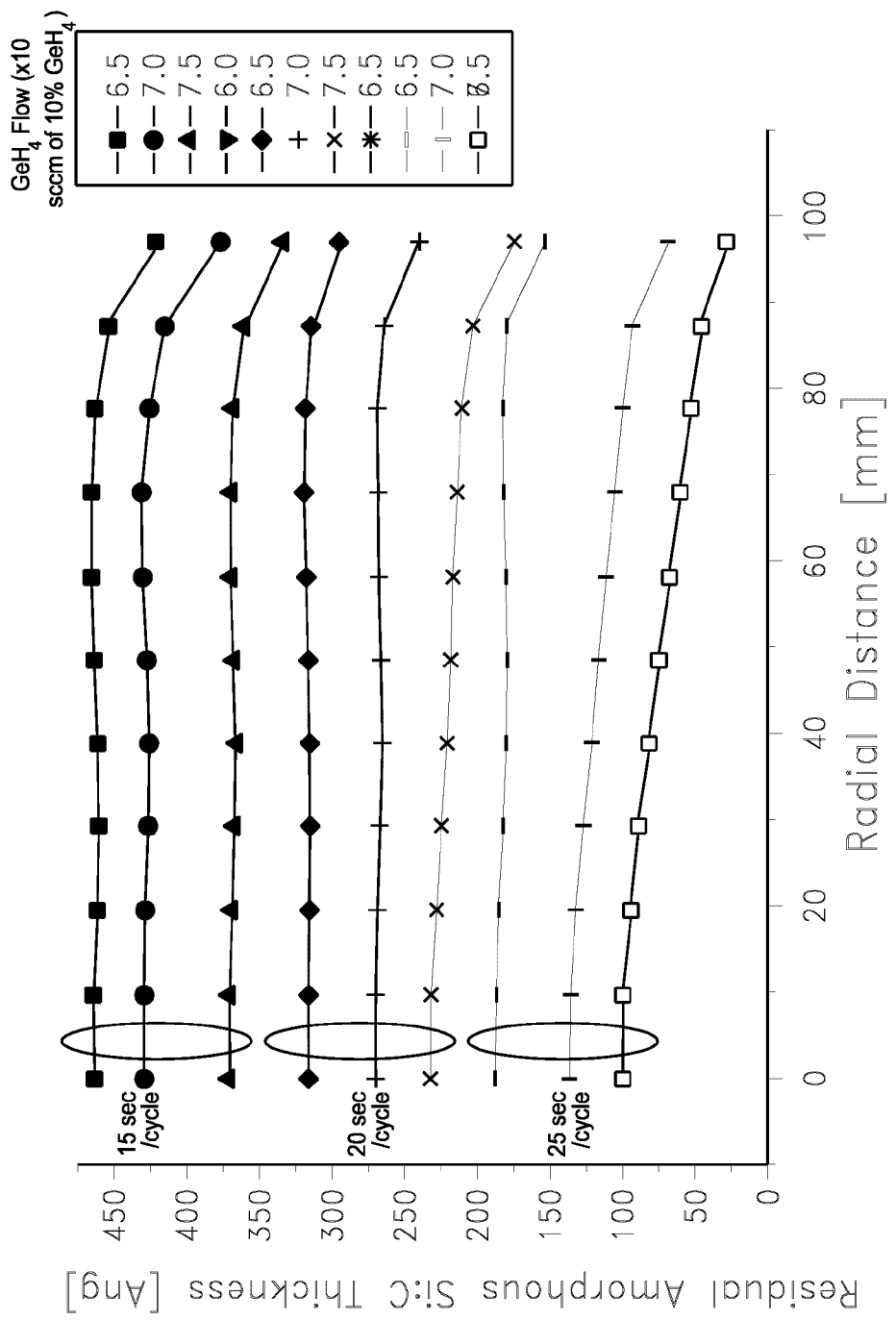
FIG. 13 shows a graph of thickness of amorphous regions of a carbon-doped silicon film deposited of a wafer as a function of radial position of the wafer for various $GeH_4$ etchant etch chemistries and various etch cycle durations.

FIG. 13 shows a graph of thickness of amorphous regions of a carbon-doped silicon film deposited on a wafer as a function of radial position of the wafer for various $GeH_4$ etchant etch chemistries and various etch cycle durations. As illustrated in FIG. 13, longer etch cycles and higher $GeH_4$ flow rates leads to more nonuniform etching. In a modified embodiment, this effect is compensated for by providing a final etch cycle of extended duration, thereby providing sufficient "overetch" to remove amorphous Si:C remaining at the center of the wafer. Accordingly, it is desirable to deposit and etch relatively small thicknesses in each cycle, preferably between about 1 nm/cycle and 10 nm/cycle, more preferably between about 2 nm/cycle and 5 nm/cycle. As noted above, conditions similar to Table A have been used to achieve net deposition rates of 4-11 nm/min.

Figure 14:
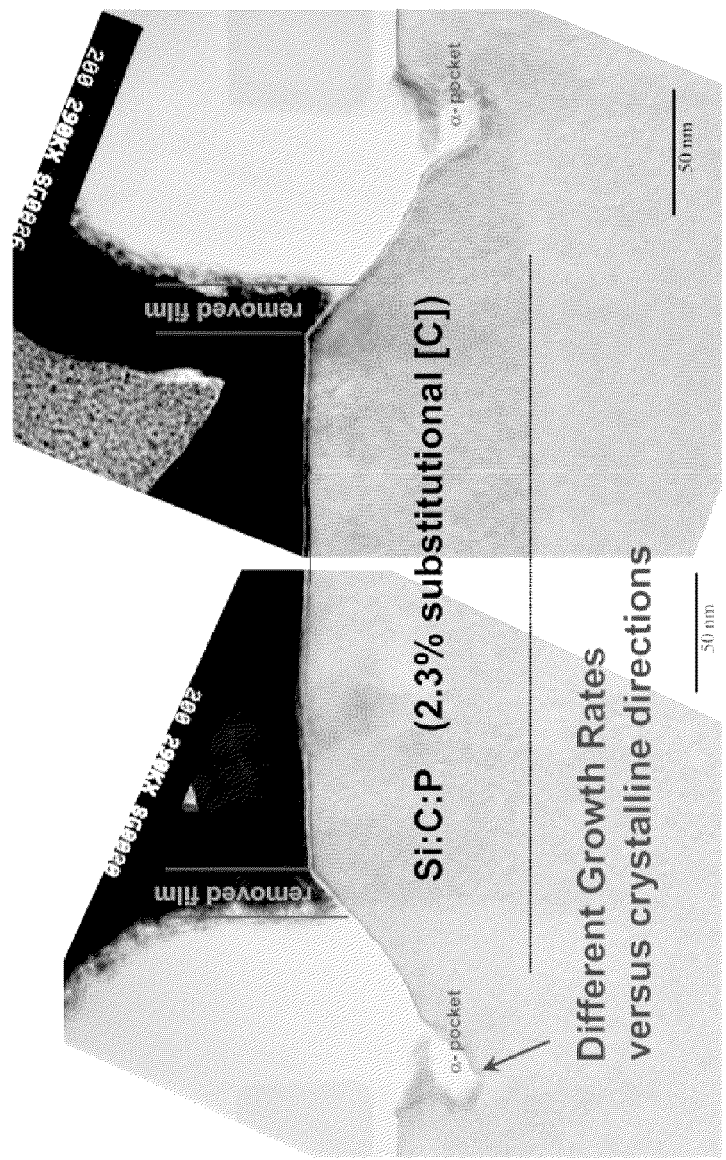
FIG. 14 is a micrograph illustrating an example partially formed carbon-doped silicon structure created by performing blanket deposition and a partial etch cycle on a patterned substrate.
Figure 16:
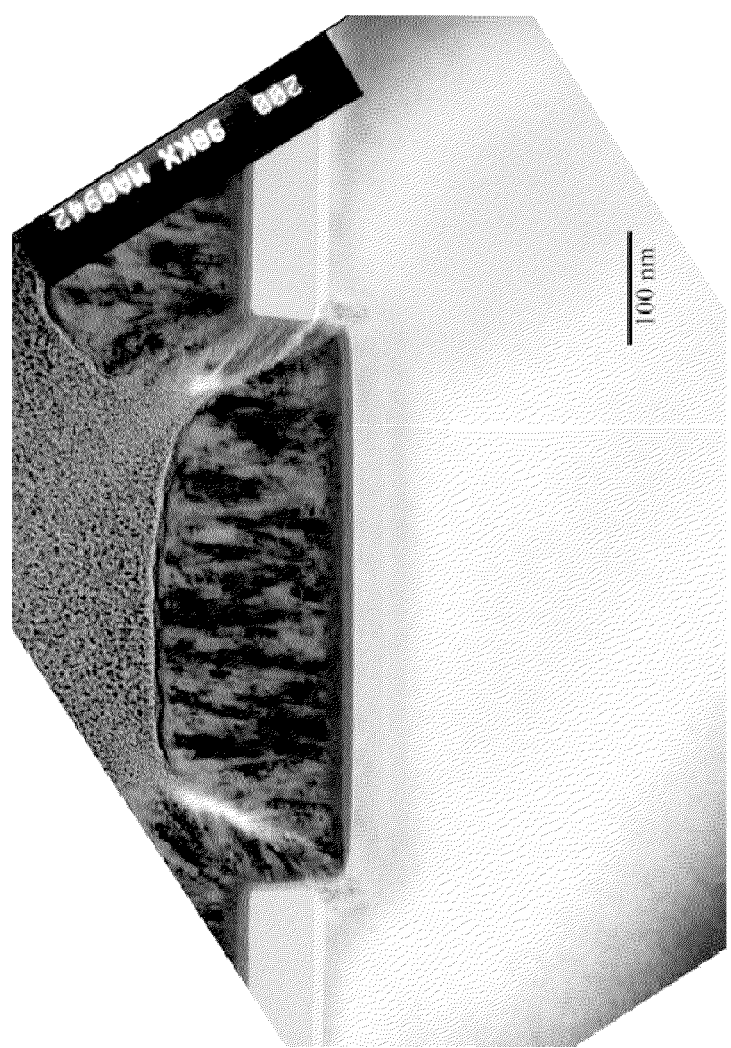
FIG. 16 is a micrograph illustrating an exemplary formed carbon-doped silicon structure created by performing multiple deposition and etch cycles on a patterned substrate.
Figure 17:
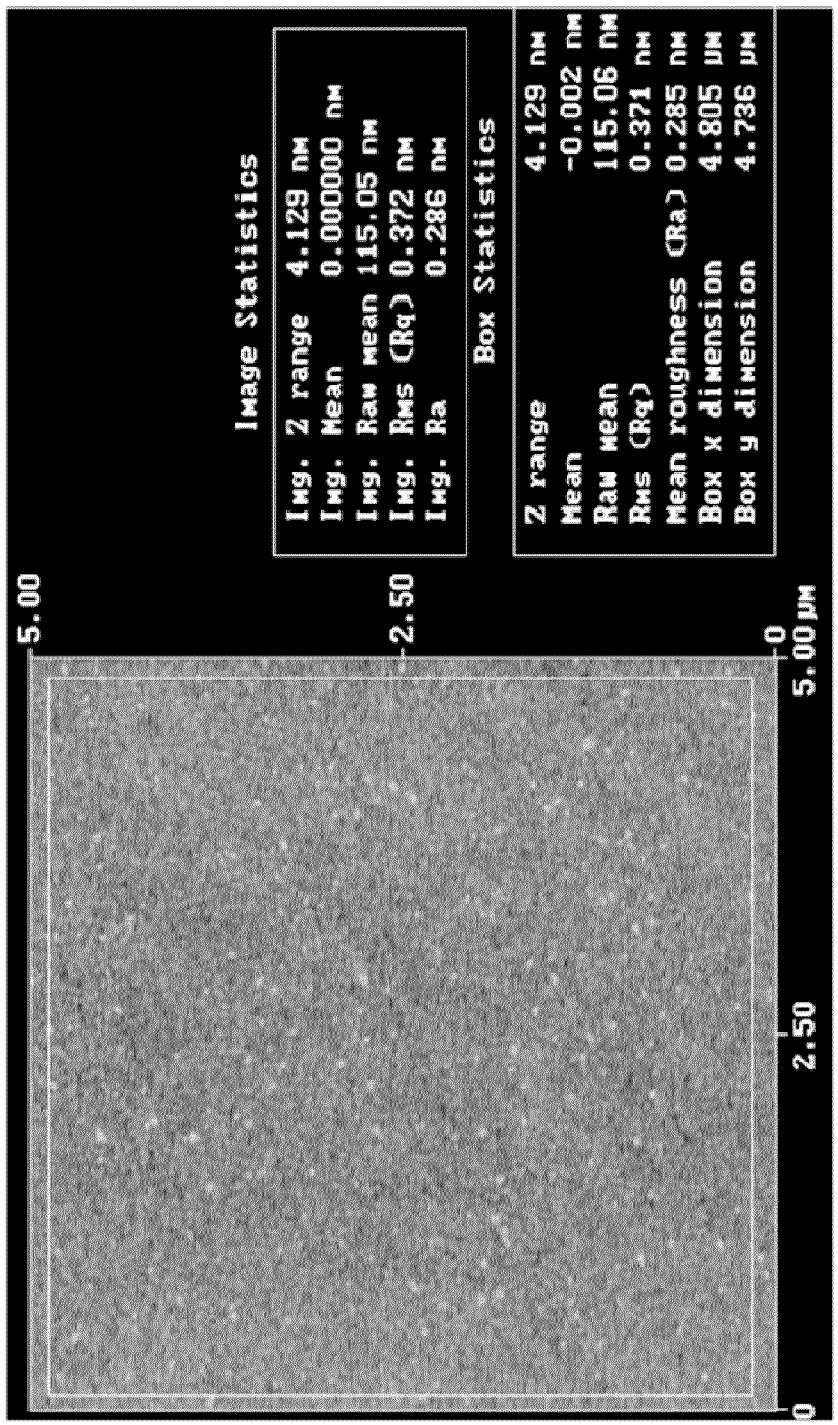
FIG. 17 illustrates an atomic force microscopy analysis of an epitaxial carbon-doped silicon film that has been selectively formed using certain of the cyclical techniques disclosed herein.

FIG. 14 is a photograph illustrating an example partially formed carbon-doped silicon structure created by performing one deposition cycle and one etch cycle on a patterned substrate. As illustrated, crystalline Si:C:P is present over an epitaxial substrate region, while amorphous Si:C:P is present over oxide. An amorphous pocket is present at the amorphous/epitaxial interface because deposition occurs at different growth rates depending on the exposed crystallographic orientation. In the structure illustrated in FIG. 14, the ratio of amorphous etch rate to epitaxial etch rate is over 20. FIG. 16 is a photograph illustrating an example partially formed carbon-doped silicon structure created by performing multiple deposition and etch cycles on a patterned substrate. As compared to FIG. 14, substantially all amorphous Si:C:P has been removed from oxide surfaces, resulting in pseudo selective epitaxial formation. FIG. 17 illustrates an atomic force microscopy analysis of a epitaxial carbon-doped silicon film that has been selectively deposited using certain of the techniques disclosed herein.

Figure 15:
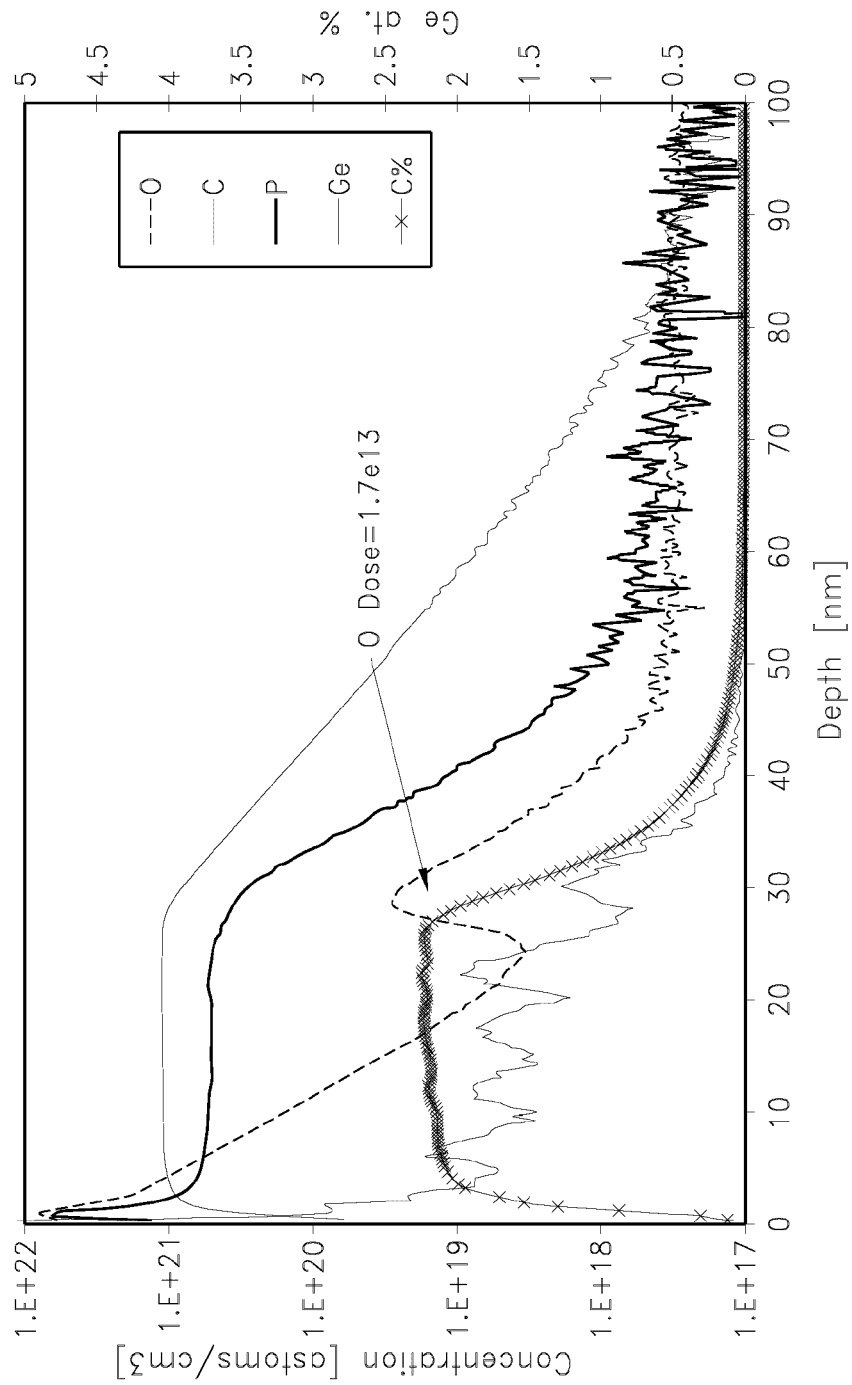
FIG. 15 shows a graph of element concentration as a function of depth for an exemplary partially formed carbon-doped silicon film formed using certain of the techniques disclosed herein.

FIG. 15 shows a graph of element concentration as a function of depth for an example partially formed carbon-doped silicon film formed using certain of the techniques disclosed herein. As illustrated, relatively modest levels of germanium are incorporated into the Si:C film due to $GeH_4$ use during the etch phase. Preferably, the germanium incorporation is less than about 5 atomic %, more preferably less than about 2 atomic %, and most preferably less than about 1 atomic %.

Figure 18:
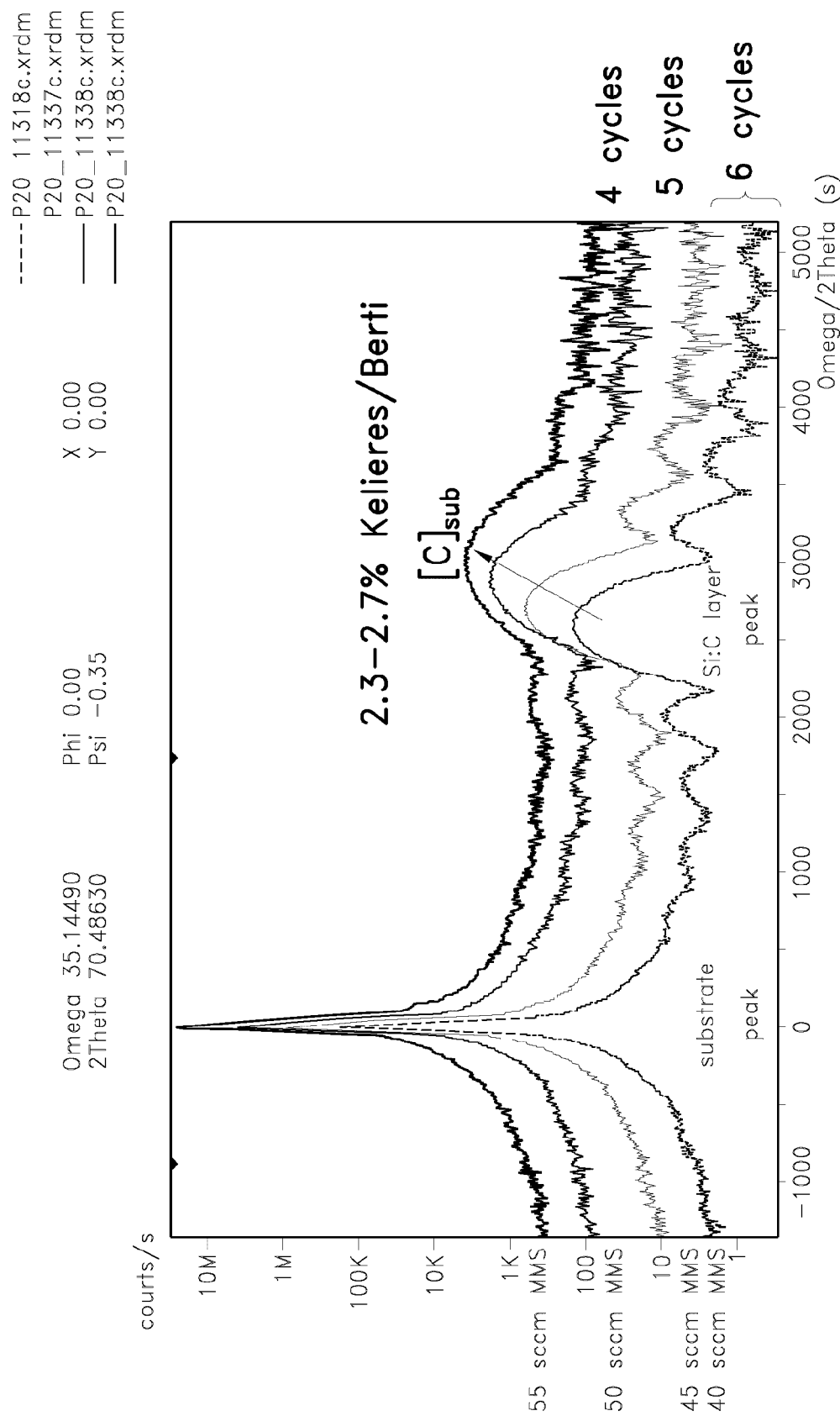
FIG. 18 shows x-ray diffraction rocking curves of carbon-doped silicon films deposited using certain of the cyclical techniques disclosed herein.

FIG. 18 shows x-ray diffraction rocking curves of carbon-doped silicon films deposited using certain of the techniques disclosed herein. The curves indicate different quantities of deposition/etch cycles, and correspond to increasing monomethylsilane ("MMS") flow rates, which corresponds to higher substitutional C concentrations in the silicon epitaxial film.

The techniques disclosed herein for selective epitaxial deposition of Si:C films provide several advantages over conventional techniques. For example, cyclical removal of polycrystalline or amorphous Si:C from insulator regions helps to improve the interface between the amorphous Si:C and the epitaxial Si:C. In particular, the cyclical process allows epitaxial growth to occur in interface regions where non-epitaxial growth would otherwise occur. Furthermore, in embodiments wherein the temperature spike during etch is omitted, such that the etch cycle is conducted at a temperature that is equal to, or only slightly elevated from, the deposition cycle, lower temperatures lead to many advantages. Throughput is improved by minimizing temperature (and/or pressure) ramp and stabilization time. Deposition temperatures can still be low enough to achieve high (e.g., 1.0-3.6 at C %) substitutional carbon content, and a large portion of the substitutional carbon and electrically active dopants remain in place during the etch, thus resulting in high substitutional carbon and dopant concentrations in the resulting film.

Several features contribute to the high throughput. For example, use of trisilane has been found to improve deposition rates at very low temperatures, thus minimizing the duration of deposition phases without sacrificing, e.g., high substitutional dopant concentrations as deposited that result from lower temperatures and higher deposition rates. The sequences and choice of precursors also facilitates largely or even wholly amorphous deposition over amorphous insulating regions while also leading to relatively uniform thicknesses (thickness ratios of less than 1.6:1) over both single-crystal and amorphous regions, minimizing overall etch time during the etch phases.

SCOPE OF THE INVENTION

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than fabrication of semiconductor devices.

We claim:

1. A method of selectively forming epitaxial semiconductor material, comprising:
   providing a substrate with insulating regions and semiconductor windows formed therein;
   blanket depositing non-epitaxial silicon-containing semiconductor material over the insulating regions and epitaxial silicon-containing semiconductor material over the semiconductor windows by flowing a carbon source vapor with trisilane over the substrate wherein the silicon-containing semiconductor material comprises carbon-doped silicon, and wherein the silicon-containing semiconductor material over the semiconductor windows comprises at least about 1.0% substitutional carbon as-deposited;
   selectively etching the non-epitaxial, non-single-crystal, silicon-containing semiconductor material from over the insulating regions while leaving at least some epitaxial silicon-containing semiconductor material in the semiconductor windows by exposing the substrate to a halide gas source and a germanium source, wherein the germanium source comprises a germanium etch catalyst;
   repeating blanket depositing and selectively removing in a plurality of cycles; and
   wherein blanket depositing and selectively removing produces a net growth rate of the silicon-containing material of between about 4 nm/min and 11 nm/min,
   wherein in each depositing step, a thickness ratio of non-epitaxial semiconductor material over the insulating regions to the epitaxial silicon-containing semiconductor material over the semiconductor windows is less than about 1.6:1.

2. The method of claim 1, wherein the semiconductor windows comprises recesses below upper surfaces of the insulating regions and repeating comprises filling the recesses with epitaxial silicon-containing semiconductor material.

3. The method of claim 2, wherein depositing comprises filling the recesses with carbon-doped silicon to form recessed source/drain structures.

4. The method of claim 3, wherein depositing further comprises in situ supplying electrical dopants to the recessed source/drain structures.

5. The method of claim 3, wherein depositing further comprises forming a carbon-free capping layer over the carbon-doped silicon.

6. The method of claim 1, wherein the semiconductor windows comprises recesses below upper surfaces of the insulating regions and the epitaxial silicon-containing semiconductor material in the recesses exerts lateral tensile strain on an adjacent region.

7. The method of claim 6, wherein selectively removing further comprises removing silicon-containing epitaxial material from sidewalls of the recesses while leaving silicon-containing epitaxial material at bottoms of the recesses.

8. The method of claim 1, wherein the ratio is between about 1.0:1 and 1.3:1.

* * * * *